United States Patent
Wu

(10) Patent No.: US 10,326,553 B2
(45) Date of Patent: Jun. 18, 2019

(54) SYSTEMATIC CODE DECODING METHOD AND APPARATUS

(71) Applicant: Huawei Technologies Co., Ltd., Shenzhen (CN)

(72) Inventor: Yuchun Wu, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 67 days.

(21) Appl. No.: 15/217,507

(22) Filed: Jul. 22, 2016

(65) Prior Publication Data
US 2016/0337080 A1 Nov. 17, 2016

Related U.S. Application Data

(63) Continuation of application No. PCT/CN2014/071210, filed on Jan. 23, 2014.

(51) Int. Cl.
*H04J 3/24* (2006.01)
*H04L 1/00* (2006.01)
*H03M 13/37* (2006.01)

(52) U.S. Cl.
CPC ...... *H04L 1/0045* (2013.01); *H03M 13/3761* (2013.01); *H04L 1/00* (2013.01); *H04L 1/0075* (2013.01)

(58) Field of Classification Search
USPC ....................................................... 370/474
See application file for complete search history.

(56) References Cited

U.S. PATENT DOCUMENTS 7,532,132 B2 * 5/2009 Shokrollahi ................. 341/50
8,073,052 B1 12/2011 Xu et al.
(Continued)

FOREIGN PATENT DOCUMENTS

CN 1138930 A 12/1996
CN 1717871 A 1/2006
(Continued)

OTHER PUBLICATIONS

"Specification Text for Systematic Raptor Forward Error Correction," 3GPP TSG System Aspects WG4 PSM ad hoc, Sophia Antipolis, France, S4-AHP238, $3^{rd}$ Generation Partnership Project, Valbonne, France (Apr. 6-8, 2005).
(Continued)

*Primary Examiner* — Phuongchau Ba Nguyen
(74) *Attorney, Agent, or Firm* — Leydig, Voit & Mayer, Ltd.

(57) ABSTRACT

Embodiments of the present invention disclose a systematic code decoding method and an apparatus. The method includes: extracting a non-erased original packet from an acquired encoded packet that has passed through an erasure channel; and then by using the erased original packet as an unknown variable, obtaining an erased original packet by parsing according to a first equation. Because a quantity F of erased original packets is far less than a total quantity K of original packets, a dimension of the first equation that includes F unknown variables is far lower than a dimension of an equation indicating a correspondence between an encoded packet and an intermediate packet. An operation amount required for parsing the relatively low-dimensional first equation is far smaller, thereby greatly reducing an operation amount required for decoding.

21 Claims, 5 Drawing Sheets

(56) References Cited

U.S. PATENT DOCUMENTS

| | | |
|---|---|---|
| 8,887,020 B2 * | 11/2014 | Shokrollahi .................. 714/752 |
| 2001/0004595 A1 | 6/2001 | Dent |
| 2002/0046021 A1 | 4/2002 | Cox et al. |
| 2004/0075593 A1 | 4/2004 | Shokrollahi et al. |
| 2007/0223620 A1 | 9/2007 | Kalhan et al. |
| 2008/0180285 A1 | 7/2008 | Shokrollahi et al. |
| 2010/0100792 A1 | 4/2010 | Abu-Surra |
| 2013/0294447 A1 | 11/2013 | Myung et al. |

FOREIGN PATENT DOCUMENTS

| | | |
|---|---|---|
| CN | 102164025 A | 8/2011 |
| CN | 102164026 A | 8/2011 |
| CN | 103346858 A | 10/2013 |

OTHER PUBLICATIONS

"3$^{rd}$ Generation Partnership Project; Technical Specification Group Services and System Aspects; Multimedia Broadcast/Multicast Service (MBMS); Protocols and codecs (Release 10)," 3GPP TS 26.346, V10.10.0, pp. 1-157, 3$^{rd}$ Generation Partnership Project, Valbonne, France (Dec. 2013).

* cited by examiner

SYSTEMATIC CODE DECODING METHOD AND APPARATUS

CROSS-REFERENCE TO RELATED APPLICATIONS

This application is a continuation of International Application No. PCT/CN2014/071210, filed on Jan. 23, 2014, which is hereby incorporated by reference in its entirety.

TECHNICAL FIELD

The present invention relates to the encoding and decoding field, and in particular, to a systematic code decoding method and an apparatus.

BACKGROUND

Encoding refers to converting, according to a standard, a source object to content in another standard format. Decoding is corresponding to encoding and refers to restoring encoded content to original object content by using a same standard that is used during encoding. There are various types of coding and decoding classifications, one of which is systematic code. A feature of the systematic code is that encoded packets output during encoding include all input original packets and may further include multiple other encoded packets. Raptor code is an encoding form of the systematic code, applicable to an erasure channel (Erasure). When encoded packets are being transmitted, some packets may be erased, and during decoding, a complete original packet set needs to be obtained by parsing according to a received non-erased encoded packet.

For example, a Raptor code encoding process is as follows:

A first step of encoding:

Based on $$A * \overset{\omega}{X} = A * \begin{bmatrix} x_1 \\ M \\ x_k \\ x_{K+1} \\ M \\ x_{K+S} \\ x_{K+S+1} \\ M \\ x_{K+S+H} \end{bmatrix} = \begin{bmatrix} 0 \\ M \\ 0 \\ m_1 \\ M \\ m_K \end{bmatrix} = \overset{\omega}{D}$$

obtain an intermediate packet set $\overset{\omega}{X}$ through calculation according to known A and $\overset{\omega}{D}$, where the last K elements of $\overset{\omega}{D}$ are original packets.

A second step of encoding:
Based on $$B * \overset{\omega}{X} = \begin{bmatrix} A \\ J \end{bmatrix} * \begin{bmatrix} x_1 \\ M \\ x_k \\ x_{K+1} \\ M \\ x_{K+S} \\ x_{K+S+1} \\ M \\ x_{K+S+H} \end{bmatrix} = \begin{bmatrix} 0 \\ M \\ 0 \\ y_1 = m_1 \\ M \\ y_K = m_K \\ y_{K+1} \\ y_{K+2} \\ M \\ y_N \end{bmatrix} = \begin{bmatrix} 0 \\ M \\ 0 \\ \overset{\omega}{Y} \end{bmatrix} = \overset{\omega}{Z},$$

obtain all encoded packets $\overset{\omega}{Y}$ through calculation according to known $$B = \begin{bmatrix} A \\ J \end{bmatrix}$$

and $\overset{\omega}{X}$ that is obtained through calculation in the first step of encoding.

Currently, for decoding of systematic code applicable to an erasure channel, an equation indicating a correspondence between an encoded packet and an intermediate packet needs to be first established; after the intermediate packet is obtained by parsing, a matrix multiplication operation is performed on the intermediate packet and a preset matrix to obtain a complete original packet set.

For example, a known algorithm for Raptor code decoding is as follows:

A first step of decoding: Obtain, according to $$B * \overset{\omega}{X} = \begin{bmatrix} 0 \\ M \\ 0 \\ \overset{\omega}{Y} \end{bmatrix} = \overset{\omega}{Z},$$

an intermediate packet $\overset{\omega}{X}$ through calculation by using a received encoded packet $\overset{\omega}{Y}$ that is not erased and a preset matrix B.

A second step of decoding: Perform matrix multiplication $$A * \overset{\omega}{X} = \overset{\omega}{D} = \begin{bmatrix} 0 \\ M \\ 0 \\ m_1 \\ M \\ m_K \end{bmatrix},$$

and obtain an original packet set $$\overset{\omega}{M} = \begin{bmatrix} m_1 \\ m_2 \\ M \\ m_K \end{bmatrix}$$

through calculation according to the known matrix A and $\overset{\omega}{X}$ that is obtained in the first step of decoding.

However, in an actual application, when a quantity K of original packets is relatively large, a dimension of a vector indicating an encoded packet set is also quite high. In this case, an intermediate packet is a quite high-dimensional matrix, and an established equation indicating a correspondence between an encoded packet and an intermediate packet is a quite high-dimensional equation. When the quite high-dimensional equation is used to obtain the intermediate packet by parsing, an operation amount is quite large. For example, when K is 1024 and a packet erasure ratio (Erasure Ratio) is 5%, approximately three and a half days are required for decoding for 10,000 times by using a decoding program of Matlab (Matlab) of a common personal computer. In this way, a large amount of time is required for decoding.

SUMMARY

Embodiments of the present invention provide a systematic code decoding method and an apparatus, so as to greatly reduce an operation amount of decoding and save decoding time.

A first aspect of the embodiments of the present invention provides a decoding apparatus, including:

a first acquiring module, configured to acquire an encoded packet that has passed through an erasure channel;

a first extracting module, configured to extract a non-erased original packet from the encoded packet that is acquired by the first acquiring module;

a parsing module, configured to obtain an erased original packet by parsing according to a first equation, where the first equation is an equation indicating a correspondence between the erased original packet and the encoded packet that is acquired by the first acquiring module, and the first equation includes F unknown variables, where F is a quantity of erased original packets in a complete encoded packet set, and the unknown variables are used to indicate the erased original packets; and a combining module, configured to combine the non-erased original packet that is extracted by the first extracting module and the erased original packet that is obtained by parsing by the parsing module to obtain a complete original packet set.

With reference to the first aspect of the embodiments of the present invention, in a first implementation manner of the first aspect of the embodiments of the present invention, the apparatus further includes:

a first constructing module, configured to construct a second equation, where the second equation is an equation indicating a correspondence between an original packet and an encoded packet;

a second acquiring module, configured to acquire a first matrix P from the second equation, where the first matrix P is associated with the erased original packet;

a second extracting module, configured to extract, from a first vector $\overset{\omega}{Y}_{NonSys}$ that indicates an encoded packet set and that is in the second equation, an encoded packet corresponding to the first matrix P to form a second vector $\overset{\omega}{Y}'$; and a second constructing module, configured to construct the first equation according to the second equation constructed by the first constructing module, the first matrix P acquired by the second acquiring module, and the second vector $\overset{\omega}{Y}'$ extracted by the second extracting module.

With reference to the first implementation manner of the first aspect of the embodiments of the present invention, in a second implementation manner of the first aspect of the embodiments of the present invention, the apparatus further includes:

a calculation module, configured to calculate a second matrix C according to a preset matrix used during encoding and decoding; and the acquiring module is specifically configured to construct, according to a preset rule, the first matrix P from the second matrix C that is calculated by the calculation module.

With reference to any one of the first aspect to the second implementation manner of the first aspect of the embodiments of the present invention, in a third implementation manner of the first aspect of the embodiments of the present invention, the parsing module specifically includes:

a first decomposition unit, configured to decompose a third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$, where the fourth vector $\overset{\omega}{M}_{Ers}$ indicates the erased original packet set, and the fifth vector $\overset{\omega}{M}_{Rcv}$ indicates the non-erased original packet set;

a second decomposition unit, configured to perform decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$;

a reconstructing unit, configured to reconstruct the first equation according to the fourth vector $\overset{\omega}{M}_{Ers}$ and the fifth vector $\overset{\omega}{M}_{Rcv}$ that are obtained by means of decomposition by the first decomposition unit and the third matrix $P_{Ers}$ and the fourth matrix $P_{Rcv}$ that are obtained by means of decomposition by the second decomposition unit, to obtain a third equation; and a parsing unit, configured to parse the third equation that is obtained by means of reconstruction by the reconstructing unit to obtain a value of an unknown variable in the fourth vector $\overset{\omega}{M}_{Ers}$.

With reference to the third implementation manner of the first aspect of the embodiments of the present invention, in a fourth implementation manner of the first aspect of the embodiments of the present invention, the first extracting module is specifically configured to extract the non-erased original packet from a sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix}$$

indicating the complete encoded packet set, where the first K encoded packets of the sixth vector $\overset{u}{Y}$ constitute the third vector $\overset{\omega}{M}$, and K is a quantity of original packets in the third vector $\overset{\omega}{M}$.

With reference to the fourth implementation manner of the first aspect of the embodiments of the present invention, in a fifth implementation manner of the first aspect of the embodiments of the present invention, the first constructing module is specifically configured to construct the second equation $C* \overset{\omega}{D} = \overset{u}{Y}_{NonSys}$, where the first (S+H) elements of a seventh vector $\overset{\omega}{D}$ are zero, and a vector constituted by the last K elements is the third vector $\overset{\omega}{M}$, that is $$\overset{\varpi}{D} = \begin{bmatrix} 0 \\ M \\ 0 \\ m_1 \\ M \\ m_K \end{bmatrix};$$

and the first vector $$\overset{\varpi}{Y}_{NonSys} = \begin{bmatrix} y_{K+1} \\ y_{K+2} \\ M \\ y_N \end{bmatrix}$$

is acquired from the sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, and N is a positive integer that is greater than or equal to K.

With reference to any one of the second implementation manner of the first aspect to the fifth implementation manner of the first aspect of the embodiments of the present invention, in a sixth implementation manner of the first aspect of the embodiments of the present invention, the calculation module is specifically configured to calculate the second matrix C according to a preset equation $C=J*A^{-1}=[C_1, C_2]$, where a fifth matrix $A^{-1}$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C.

With reference to the sixth implementation manner of the first aspect of the embodiments of the present invention, in a seventh implementation manner of the first aspect of the embodiments of the present invention, the acquiring module is specifically configured to select (F+ε) row vector or vectors from the ninth matrix $C_2$ according to a preset rule to form the first matrix $$P = \begin{bmatrix} \overset{\varpi}{p}_{r_1} \\ \overset{\varpi}{p}_{r_2} \\ M \\ \overset{\varpi}{p}_{r_{F+\varepsilon}} \end{bmatrix},$$

where ε is a preset value, and the preset rule is as follows:
(1) in the row vector, not all F elements corresponding to F erased original packets in the third vector $\overset{\omega}{M}$ are zero; and
(2) an encoded packet, in the first vector $\overset{\omega}{Y}_{NonSys}$, corresponding to the row vector is not erased; and
correspondence between the row vector and the third vector $\overset{\omega}{M}$, and correspondence between the row vector and the first vector $\overset{\omega}{Y}_{NonSys}$ are obtained according to the second equation.

With reference to the seventh implementation manner of the first aspect of the embodiments of the present invention, in an eighth implementation manner of the first aspect of the embodiments of the present invention, the second extracting module is specifically configured to extract, from the first vector $\overset{u}{Y}_{Nonsys}$, an encoded packet corresponding to (F+ε) row vector or vectors in the first matrix P to form the second vector $\overset{\omega}{Y'}=[y_{K+r_1}, y_{K+r_2} \Lambda y_{K+r_{F+\varepsilon}}]^T$.

With reference to the eighth implementation manner of the first aspect of the embodiments of the present invention, in a ninth implementation manner of the first aspect of the embodiments of the present invention, the second constructing module is specifically configured to construct the first equation: $P* \overset{\omega}{M} = \overset{\omega}{Y'}$.

With reference to the third implementation manner of the first aspect to the ninth implementation manner of the first aspect of the embodiments of the present invention, in a tenth implementation manner of the first aspect of the embodiments of the present invention, the first decomposition unit is specifically configured to displace the F erased original packets in the third vector $\overset{\omega}{M}$ to the first F locations to form an eighth vector $$\overset{\varpi}{M'} = \begin{bmatrix} (\overset{\varpi}{M}_{Ers})^T \\ (\overset{\varpi}{M}_{Rcv})^T \end{bmatrix} = \begin{bmatrix} m_{e_1} \\ m_{e_2} \\ M \\ m_{e_F} \\ (\overset{\varpi}{M}_{Rcv})^T \end{bmatrix}.$$

With reference to the tenth implementation manner of the first aspect of the embodiments of the present invention, in an eleventh implementation manner of the first aspect of the embodiments of the present invention, the second decomposition unit is specifically configured to perform displacement, corresponding to the eighth vector $\overset{\omega}{M'}$, on the first matrix P to obtain a tenth matrix $P'=[P_{Ers}, P_{Rcv}]$, where each column in the third matrix $P_{Ers}$ is corresponding to an erased original packet in the fourth vector $\vec{M}_{Ers}$, and each column in the fourth matrix $P_{Rcv}$ is corresponding to a non-erased original packet in the fifth vector $\vec{M}_{Rcv}$.

With reference to the eleventh implementation manner of the first aspect of the embodiments of the present invention, in a twelfth implementation manner of the first aspect of the embodiments of the present invention, the reconstructing unit is specifically configured to transform the first equation $P * \vec{M} = \vec{Y'}$ into the third equation $P_{Ers} * (\vec{M}_{Ers})^T = \vec{Y'} - P_{Rcv} * (\vec{M}_{Rcv})^T$.

With reference to the twelfth implementation manner of the first aspect of the embodiments of the present invention, in a thirteenth implementation manner of the first aspect of the embodiments of the present invention, the combining module is specifically configured to combine the fifth vector $\vec{M}_{Rcv}$ indicating the non-erased original packet set and the fourth vector $\vec{M}_{Ers}$ that is obtained by the parsing unit by parsing and that indicates the erased original packet set to obtain the complete original packet set.

A second aspect of the embodiments of the present invention provides a decoding apparatus, including:

a receiver, configured to receive an encoded packet that is transmitted by a transmit end; and a processor, configured to perform the following operations:

extracting a non-erased original packet from the encoded packet received by the receiver;

obtaining an erased original packet by parsing according to a first equation, where the first equation is an equation indicating a correspondence between the erased original packet and the received encoded packet, and the first equation includes F unknown variables, where F is a quantity of erased original packets in a complete encoded packet set, and the unknown variables are used to indicate the erased original packets; and combining the extracted non-erased original packet and the erased original packet obtained by parsing to obtain a complete original packet set.

With reference to the second aspect of the embodiments of the present invention, in a first implementation manner of the second aspect of the embodiments of the present invention, the processor is further configured to:

construct a second equation, where the second equation is an equation indicating a correspondence between an original packet and an encoded packet;

acquire a first matrix P from the second equation, where the first matrix P is associated with the erased original packet;

extract, from a first vector $\vec{Y}_{NonSys}$ that indicates an encoded packet set and that is in the second equation, an encoded packet corresponding to the first matrix P to form a second vector $\vec{Y'}$; and construct the first equation according to the second equation, the first matrix P, and the second vector $\vec{Y'}$.

With reference to the first implementation manner of the second aspect of the embodiments of the present invention, in a second implementation manner of the second aspect of the embodiments of the present invention, the processor is further configured to calculate a second matrix C according to a preset matrix used during encoding and decoding; and the processor performs the operation of acquiring a first matrix P from the second equation, and is specifically configured to:

construct, according to a preset rule, the first matrix P from the second matrix C that is calculated by the calculation unit.

With reference to any one of the second aspect to the second implementation manner of the second aspect of the embodiments of the present invention, in a third implementation manner of the second aspect of the embodiments of the present invention, the processor performs the operation of obtaining an erased original packet by parsing according to a first equation, and is specifically configured to:

decompose a third vector $\vec{M}$ that indicates the complete original packet set and that is in the first equation into a fourth vector $\vec{M}_{Ers}$ and a fifth vector $\vec{M}_{Rcv}$, where the fourth vector $\vec{M}_{Ers}$ indicates the erased original packet set, and the fifth vector $\vec{M}_{Rcv}$ indicates the non-erased original packet set;

perform decomposition, corresponding to the fourth vector $\vec{M}_{Ers}$ and the fifth vector $\vec{M}_{Rcv}$, on the first matrix P in the first equation to obtain a third matrix $P_{Ers}$ and a fourth matrix $P_{Rcv}$;

reconstruct the first equation according to the fourth vector $\vec{M}_{Ers}$, the fifth vector $\vec{M}_{Rcv}$, the third matrix $P_{Ers}$, and the fourth matrix $P_{Rcv}$, to obtain a third equation; and parse the third equation to obtain a value of an unknown variable in the fourth vector $\vec{M}_{Ers}$.

With reference to the third implementation manner of the second aspect of the embodiments of the present invention, in a fourth implementation manner of the second aspect of the embodiments of the present invention, the processor performs the operation of extracting a non-erased original packet from the encoded packet received by the receiver, and is specifically configured to extract the non-erased original packet from a sixth vector $$\vec{Y} = \begin{bmatrix} y_1 = m_1 \\ M \\ y_K = m_K \\ y_{K+1} \\ y_{K+2} \\ M \\ y_N \end{bmatrix}$$

indicating the complete encoded packet set, where the first K encoded packets of the sixth vector $\vec{Y}$ constitute the third vector $\vec{M}$, and K is a quantity of original packets in the third vector $\vec{M}$.

With reference to the fourth implementation manner of the second aspect of the embodiments of the present invention, in a fifth implementation manner of the second aspect of the embodiments of the present invention, the processor performs the operation of constructing a second equation, and is specifically configured to construct the second equation $C * \overset{\omega}{D} = \overset{u}{Y}_{NonSys}$, where the first (S+H) elements of a seventh vector $\overset{\omega}{D}$ are zero, and a vector constituted by the last K elements is the third vector $\overset{\omega}{M}$, that is $$\overset{\omega}{D} = \begin{bmatrix} 0 \\ M \\ 0 \\ m_1 \\ M \\ m_K \end{bmatrix};$$

and $$\overset{\omega}{Y}_{NonSys} = \begin{bmatrix} y_{K+1} \\ y_{K+2} \\ M \\ y_N \end{bmatrix}$$

is acquired from the sixth vector $$\overset{\omega}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, and N is a positive integer that is greater than or equal to K.

With reference to any one of the second implementation manner of the second aspect to the fifth implementation manner of the second aspect of the embodiments of the present invention, in a sixth implementation manner of the second aspect of the embodiments of the present invention, the processor performs the operation of calculating a second matrix C according to a preset matrix used during encoding and decoding, and is specifically configured to:

calculate the second matrix C according to a preset equation $C=J*A^{-1}=[C_1, C_2]$, where a fifth matrix $A^{-1}$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C.

With reference to the sixth implementation manner of the second aspect of the embodiments of the present invention, in a seventh implementation manner of the second aspect of the embodiments of the present invention, the processor performs the operation of constructing, according to a preset rule, the first matrix P from the second matrix C that is calculated by the calculation unit, and is specifically configured to:

select (F+ε) row vector or vectors from the ninth matrix $C_2$ according to a preset rule to form the first matrix $$P = \begin{bmatrix} \overset{\omega}{p}_{r_1} \\ \overset{\omega}{p}_{r_2} \\ M \\ \overset{\omega}{p}_{r_{F+\varepsilon}} \end{bmatrix},$$

where ε is a preset value, and the preset rule is as follows:
(1) in the row vector, not all F elements corresponding to F erased original packets in the third vector $\overset{\omega}{M}$ are zero; and
(2) an encoded packet, in the first vector $\overset{\omega}{Y}_{NonSys}$, corresponding to the row vector is not erased; and
correspondence between the row vector and the third vector $\overset{\omega}{M}$, and correspondence between the row vector and the first vector $\overset{\omega}{Y}_{NonSys}$ are obtained according to the second equation.

With reference to the seventh implementation manner of the second aspect of the embodiments of the present invention, in an eighth implementation manner of the second aspect of the embodiments of the present invention, the processor performs the operation of extracting, from a first vector $\overset{\omega}{Y}_{NonSys}$ that indicates an encoded packet set and that is in the second equation, an encoded packet corresponding to the first matrix P to form a second vector $\overset{\omega}{Y'}$, and is specifically configured to extract, from the first vector $\overset{u}{Y}_{NonSys}$, an encoded packet corresponding to (F+ε) row vector or vectors in the first matrix P to form the second vector $\overset{\omega}{Y'} = [y_{K+r_1}, y_{K+r_2} \Lambda y_{K+r_{F+\varepsilon}}]^T$.

With reference to the eighth implementation manner of the second aspect of the embodiments of the present invention, in a ninth implementation manner of the second aspect of the embodiments of the present invention, the processor performs the operation of constructing the first equation according to the second equation, the first matrix P, and the second vector $\overset{\omega}{Y'}$, and is specifically configured to construct the first equation: $P * \overset{\omega}{M} = \overset{\omega}{Y'}$.

With reference to the third implementation manner of the second aspect to the ninth implementation manner of the second aspect of the embodiments of the present invention, in a tenth implementation manner of the second aspect of the embodiments of the present invention, the processor performs the operation of decomposing a third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$, and is specifically configured to:

displace the F erased original packets in the third vector $\overset{\omega}{M}$ to the first F locations to form an eighth vector $$\overset{\omega}{M'} = \begin{bmatrix} (\overset{\omega}{M}_{Ers})^T \\ (\overset{\omega}{M}_{Rcv})^T \end{bmatrix} = \begin{bmatrix} m_{e_1} \\ m_{e_2} \\ M \\ m_{e_F} \\ (\overset{\omega}{M}_{Rcv})^T \end{bmatrix}.$$

With reference to the tenth implementation manner of the second aspect of the embodiments of the present invention, in an eleventh implementation manner of the second aspect of the embodiments of the present invention, the processor performs the operation of performing decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$, and is specifically configured to:

perform displacement, corresponding to the eighth vector $\overset{\omega}{M'}$, on the first matrix P to obtain a tenth matrix $P'[P_{Ers}, P_{Rcv}]$, where each column in the third matrix $P_{Ers}$ is corresponding to an erased original packet in the fourth vector $\overset{\omega}{M}_{Ers}$, and each column in the fourth matrix $P_{Rcv}$ is corresponding to a non-erased original packet in the fifth vector $\overset{\omega}{M}_{Rcv}$.

With reference to the eleventh implementation manner of the second aspect of the embodiments of the present invention, in a twelfth implementation manner of the second aspect of the embodiments of the present invention, the processor performs the operation of reconstructing the first equation according to the fourth vector $\overset{\omega}{M}_{Ers}$, the fifth vector $\overset{\omega}{M}_{Rcv}$, the third matrix $P_{Ers}$, and the fourth matrix $P_{Rcv}$ to obtain a third equation, and is specifically configured to:

transform the first equation $P * \overset{\omega}{M} = \overset{\omega}{Y'}$ into the third equation $P_{Ers} * (\overset{\omega}{M}_{Ers})^T = \overset{\omega}{Y'} - P_{Rcv} * (\overset{\omega}{M}_{Rcv})^T$.

With reference to the twelfth implementation manner of the second aspect of the embodiments of the present invention, in a thirteenth implementation manner of the second aspect of the embodiments of the present invention, the processor performs the operation of combining the extracted non-erased original packet and the erased original packet obtained by parsing to obtain a complete original packet set, and is specifically configured to:

combine the fifth vector $\overset{\omega}{M}_{Rcv}$ indicating the non-erased original packet set and the fourth vector $\overset{\omega}{M}_{Ers}$ that is obtained by parsing and that indicates the erased original packet set to obtain the complete original packet set.

A third aspect of the embodiments of the present invention provides a systematic code decoding method, including:

acquiring, by a decoding apparatus, an encoded packet that has passed through an erasure channel;

extracting, by the decoding apparatus, a non-erased original packet from the acquired encoded packet;

obtaining, by the decoding apparatus by parsing, an erased original packet according to a first equation, where the first equation is an equation indicating a correspondence between the erased original packet and the acquired encoded packet, and the first equation includes F unknown variables, where F is a quantity of erased original packets in a complete encoded packet set, and the unknown variables are used to indicate the erased original packets; and combining, by the decoding apparatus, the extracted non-erased original packet and the erased original packet obtained by parsing to obtain a complete original packet set.

With reference to the third aspect of the embodiments of the present invention, in a first implementation manner of the third aspect of the embodiments of the present invention, before the step of obtaining, by the decoding apparatus by parsing, an erased original packet according to a first equation, including:

constructing, by the decoding apparatus, a second equation, where the second equation is an equation indicating a correspondence between an original packet and an encoded packet;

acquiring, by the decoding apparatus, a first matrix P from the second equation, where the first matrix P is associated with the erased original packet;

extracting, by the decoding apparatus from a first vector $\overset{\omega}{Y}_{NonSys}$ that indicates an encoded packet set and that is in the second equation, an encoded packet corresponding to the first matrix P to form a second vector $\overset{\omega}{Y'}$; and constructing, by the decoding apparatus, the first equation according to the second equation, the first matrix P, and the second vector $\overset{\omega}{Y'}$.

With reference to the first implementation manner of the third aspect of the embodiments of the present invention, in a second implementation manner of the third aspect of the embodiments of the present invention, before the step of constructing, by the decoding apparatus, a second equation, including:

calculating, by the decoding apparatus, a second matrix C according to a preset matrix used during encoding and decoding; and the acquiring, by the decoding apparatus, a first matrix P from the second equation includes:

constructing, by the decoding apparatus, the first matrix P from the second matrix C according to a preset rule.

With reference to any one of the third aspect to the second implementation manner of the third aspect of the embodiments of the present invention, in a third implementation manner of the third aspect of the embodiments of the present invention, the obtaining, by the decoding apparatus by parsing, an erased original packet according to a first equation includes:

decomposing, by the decoding apparatus, a third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$, where the fourth vector $\overset{\omega}{M}_{Ers}$ indicates the erased original packet set, and the fifth vector $\overset{\omega}{M}_{Rcv}$ indicates the non-erased original packet set;

performing, by the decoding apparatus, decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$;

reconstructing, by the decoding apparatus, the first equation according to the fourth vector $\overset{\omega}{M}_{Ers}$, the fifth vector $\overset{\omega}{M}_{Rcv}$, the third matrix $P_{Ers}$, and the fourth matrix $P_{Rcv}$, to obtain a third equation; and parsing, by the decoding apparatus, the third equation to obtain a value of an unknown variable in the fourth vector $\overset{\omega}{M}_{Ers}$.

With reference to the third implementation manner of the third aspect of the embodiments of the present invention, in a fourth implementation manner of the third aspect of the embodiments of the present invention, the extracting, by the decoding apparatus, a non-erased original packet from the received encoded packet includes:

extracting, by the decoding apparatus, the non-erased original packet from a sixth vector $$\overset{\omega}{Y} = \begin{bmatrix} y_1 = m_1 \\ M \\ y_K = m_K \\ y_{K+1} \\ y_{K+2} \\ M \\ y_N \end{bmatrix}$$

indicating the complete encoded packet set, where the first K encoded packets of the sixth vector $\overset{u}{Y}$ constitute the third vector $\overset{\omega}{M}$, and K is a quantity of original packets in the third vector $\overset{\omega}{M}$.

With reference to the fourth implementation manner of the third aspect of the embodiments of the present invention, in a fifth implementation manner of the third aspect of the embodiments of the present invention, the constructing, by the decoding apparatus, a second equation includes:

constructing, by the decoding apparatus, the second equation $C * \overset{\omega}{D} = \overset{\omega}{Y}_{NonSys}$, where the first (S+H) elements of the seventh vector $\overset{\omega}{D}$ are zero, and a vector constituted by the last K elements is the third vector $\overset{\omega}{M}$, that is $$\overset{\omega}{D} = \begin{bmatrix} 0 \\ M \\ 0 \\ m_1 \\ M \\ m_K \end{bmatrix};$$

and $$\overset{\omega}{Y}_{NonSys} = \begin{bmatrix} y_{K+1} \\ y_{K+2} \\ M \\ y_N \end{bmatrix}$$

is acquired from the sixth vector $$\overset{\omega}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, K is a quantity of original packets in the complete original packet set, and N is a positive integer that is greater than or equal to K.

With reference to any one of the second implementation manner of the third aspect to the fifth implementation manner of the third aspect of the embodiments of the present invention, in a sixth implementation manner of the third aspect of the embodiments of the present invention, the calculating, by the decoding apparatus, a second matrix C according to a preset matrix used during encoding and decoding includes:

calculating, by the decoding apparatus, the second matrix C according to a preset equation $C = J*A^{-1} = [C_1, C_2]$, where a fifth matrix $A^{-1}$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C.

With reference to the sixth implementation manner of the third aspect of the embodiments of the present invention, in a seventh implementation manner of the third aspect of the embodiments of the present invention, the constructing, by the decoding apparatus, the first matrix P from the second matrix C according to a preset rule includes:

selecting, by the decoding apparatus, (F+ε) row vector or vectors from the ninth matrix $C_2$ according to a preset rule to form the first matrix $$P = \begin{bmatrix} \overset{\omega}{p}_{r_1} \\ \overset{\omega}{p}_{r_2} \\ M \\ \overset{\omega}{p}_{r_{F+\varepsilon}} \end{bmatrix},$$

where ε is a preset value, and the preset rule is as follows:

(1) in the row vector, not all F elements corresponding to F erased original packets in the third vector $\overset{\omega}{M}$ are zero; and (2) an encoded packet, in the first vector $\overset{u}{Y}$, corresponding to the row vector is not erased; and correspondence between the row vector and the third vector $\overset{\omega}{M}$, and correspondence between the row vector and the first vector $\overset{u}{Y}$ are obtained according to the second equation.

With reference to the eighth implementation manner of the second aspect of the embodiments of the present invention, in an eighth implementation manner of the third aspect of the embodiments of the present invention, the extracting, by the decoding apparatus from a first vector $\overset{u}{Y}$ that indicates a complete encoded packet set and that is in the second equation, an encoded packet corresponding to the second matrix P to form a second vector $\overset{\omega}{Y'}$ includes:

extracting, by the decoding apparatus from the first vector $\overset{u}{Y}_{NonSys}$, an encoded packet corresponding to (F+ε) row vector or vectors in the first matrix P to form the second vector $\overset{\omega}{Y'} = [y_{K+r_1}, y_{K+r_2} \Lambda y_{K+r_{F+\varepsilon}}]^T$.

With reference to the eighth implementation manner of the third aspect of the embodiments of the present invention, in a ninth implementation manner of the third aspect of the embodiments of the present invention, the constructing, by the decoding apparatus, the first equation according to the second equation, the first matrix P, and the second vector $\overset{\omega}{Y'}$ includes:

constructing, by the decoding apparatus, the first equation: $P * \overset{\omega}{M'} = \overset{\omega}{Y'}$.

With reference to the third implementation manner of the third aspect to the ninth implementation manner of the third aspect of the embodiments of the present invention, in a tenth implementation manner of the third aspect of the embodiments of the present invention, the decomposing, by the decoding apparatus, a third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$ includes:

displacing, by the decoding apparatus, the F erased original packets in the third vector $\overset{\omega}{M}$ to the first F locations to form an eighth vector $$\overset{\varpi}{M'} = \begin{bmatrix} (\overset{\varpi}{M}_{Ers})^T \\ (\overset{\varpi}{M}_{Rcv})^T \end{bmatrix} = \begin{bmatrix} m_{e_1} \\ m_{e_2} \\ M \\ m_{e_F} \\ (\overset{\varpi}{M}_{Rcv})^T \end{bmatrix}.$$

With reference to the eighth implementation manner of the second aspect of the embodiments of the present invention, in an eleventh implementation manner of the third aspect of the embodiments of the present invention, the performing, by the decoding apparatus, decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$ includes:

performing, by the decoding apparatus, displacement, corresponding to the eighth vector $\overset{\omega}{M'}$, on the first matrix P to obtain a tenth matrix $P'=[P_{Ers}, R_{Rcv}]$, where each column in the third matrix $P_{Ers}$ is corresponding to an erased original packet in the fourth vector $\overset{\omega}{M}_{Ers}$, and each column in the fourth matrix $P_{Rcv}$ is corresponding to a non-erased original packet in the fifth vector $\overset{\omega}{M}_{Rcv}$.

With reference to the eleventh implementation manner of the third aspect of the embodiments of the present invention, in a twelfth implementation manner of the third aspect of the embodiments of the present invention, the reconstructing, by the decoding apparatus, the first equation according to the fourth vector $\overset{\omega}{M}_{Ers}$, the fifth vector $\overset{\omega}{M}_{Rcv}$, the third matrix $P_{Ers}$, and the fourth matrix $P_{Rcv}$ to obtain a third equation includes:

transforming, by the decoding apparatus, the first equation $P * \overset{\omega}{M'} = \overset{\omega}{Y'}$ into the third equation $P_{Ers} * (\overset{\omega}{M}_{Ers})^T = \overset{\omega}{Y'} - P_{Rcv} * (\overset{\omega}{M}_{Rcv})^T$.

With reference to the twelfth implementation manner of the third aspect of the embodiments of the present invention, in a thirteenth implementation manner of the third aspect of the embodiments of the present invention, the combining, by the decoding apparatus, the extracted non-erased original packet and the erased original packet obtained by parsing to obtain a complete original packet set includes:

combining, by the decoding apparatus, the fifth vector $\overset{\omega}{M}_{Rcv}$ indicating the non-erased original packet set and the fourth vector $\overset{\omega}{M}_{Ers}$ that is obtained by parsing and that indicates the erased original packet set to obtain the complete original packet set.

It can be seen from the foregoing technical solutions that, the embodiments of the present invention have the following advantages: in the embodiments of the present invention, a decoding apparatus first extracts a non-erased original packet from an acquired encoded packet that has passed through an erasure channel; and then by using the erased original packet as an unknown variable, obtains an erased original packet by parsing according to a first equation, where the first equation is an equation indicating a correspondence between the erased original packet and the acquired encoded packet. Because a quantity F of erased original packets is far less than a total quantity K of original packets, a dimension of the first equation that includes F unknown variables is far lower than a dimension of an equation indicating a correspondence between an encoded packet and an intermediate packet. An operation amount required for parsing the relatively low-dimensional first equation is far smaller than that for parsing the quite high-dimensional equation indicating the correspondence between an encoded packet and an intermediate packet, thereby greatly reducing an operation amount required for decoding. For example, when K is 1024 and a packet erasure ratio Erasure Ratio is 5%, by using this decoding method, only approximately 22 minutes are required for decoding for 10,000 times by using a decoding program of Matlab (Matlab) of a common PC, which greatly reduces time required for decoding and improves decoding efficiency.

BRIEF DESCRIPTION OF DRAWINGS FIG.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by persons skilled in the art based on the embodiments of the present invention without creative efforts shall fall within the protection scope of the present invention.

Figure 1:
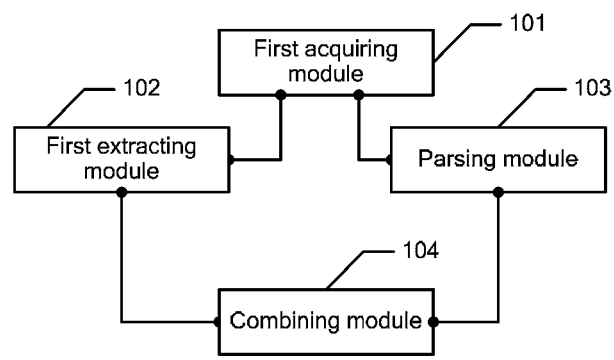
FIG. 1 is a schematic structural diagram of a decoding apparatus in an embodiment of the present invention.

Referring to FIG. 1, an embodiment of a decoding apparatus in the embodiments of the present invention includes:

a first acquiring module 101, configured to acquire an encoded packet that has passed through an erasure channel;

a first extracting module 102, configured to extract a non-erased original packet from the encoded packet that is acquired by the first acquiring module 101;

a parsing module 103, configured to obtain an erased original packet by parsing according to a first equation, where the first equation is an equation indicating a correspondence between the erased original packet and the encoded packet that is acquired by the first acquiring module 101, and the first equation includes F unknown variables, where F is a quantity of erased original packets in a complete encoded packet set, and the unknown variables are used to indicate the erased original packets; and a combining module 104, configured to combine the non-erased original packet that is extracted by the first extracting module 102 and the erased original packet that is obtained by the resolving module 103 by parsing to obtain a complete original packet set.

The erasure channel is a mathematical model indicating a specific feature. An encoded packet that passes through the erasure channel is not always erased but is erased randomly. For example, in a communication scenario, a transmit end sends 100 encoded packets, but a receive end receives only 98 encoded packets due to route congestion or channel deterioration in a routing process. In this case, two encoded packets that are not received are referred to as erased encoded packets. The receive end knows which two encoded packets, such as the $3^{rd}$ encoded packet and the $51^{st}$ encoded packet, of the 100 encoded packets are erased. After these 100 encoded packets pass through an erasure channel, the $3^{rd}$ encoded packet and the $51^{st}$ encoded packet thereof may be referred to as erased packets, and the rest 98 encoded packets may be referred to as non-erased encoded packets. In a storage scenario, a phenomenon of generating a same feature as that is generated after an erasure channel has been passed through in the communication scenario is also referred to as having passed through an erasure channel. For example, 100 original packets are encoded to generate 110 encoded packets by means of systematic Raptor code encoding and stored. Due to damage of a storage unit or another reason, the $8^{th}$ encoded packet and the 60th encoded packet thereof are erased. After these 110 encoded packets pass through an erasure channel, the $8^{th}$ encoded packet and the $60^{th}$ encoded packet may be referred to as erased encoded packets, and the rest 108 encoded packets may be referred to as non-erased encoded packets.

In this embodiment of the present invention, a first extracting module 102 first extracts a non-erased original packet from an encoded packet that is acquired by a first acquiring module 101; and then by using the erased original packet as an unknown variable, a parsing module 103 obtains an erased original packet by parsing according to a first equation, where the first equation is an equation indicating a correspondence between the erased original packet and the acquired encoded packet. Because a quantity F of erased original packets is far less than a total quantity K of original packets, a dimension of the first equation that includes F unknown variables is far lower than a dimension of an equation indicating a correspondence between an encoded packet and an intermediate packet. An operation amount required for parsing the relatively low-dimensional first equation is far smaller than that for parsing the quite high-dimensional equation indicating the correspondence between an encoded packet and an intermediate packet, thereby greatly reducing an operation amount required for decoding. For example, when K is 1024 and a packet erasure ratio (Erasure Ratio) is 5%, by using this decoding method, only approximately 22 minutes are required for decoding for 10,000 times by using a decoding program of Matlab (Matlab) of a common PC, where the time required is only approximately 1/230 of time required by using an original decoding algorithm, thereby greatly reducing time required for decoding and improving decoding efficiency.

Figure 2:
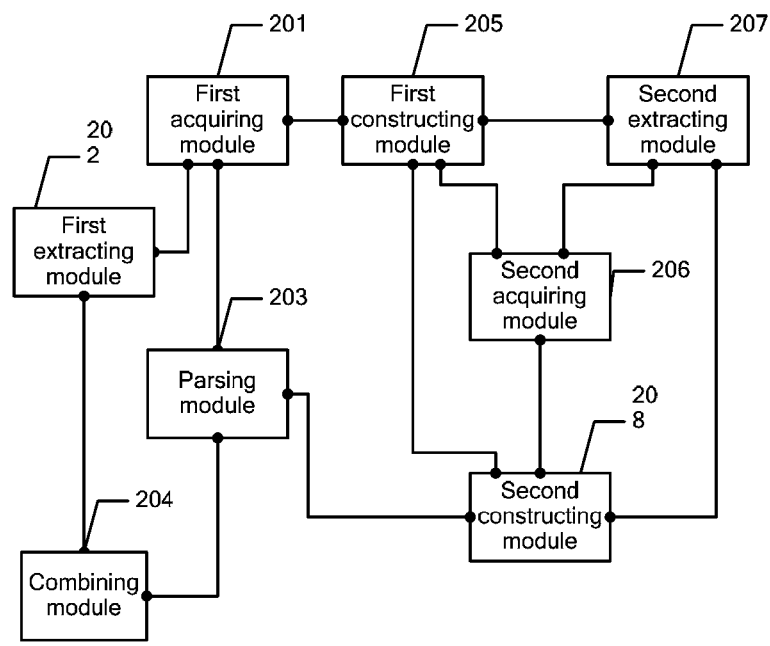
FIG. 2 is another schematic structural diagram of a decoding apparatus in an embodiment of the present invention.

In the foregoing embodiment, the parsing module 103 obtains the erased original packet by parsing according to the first equation. In an actual application, the decoding apparatus may first construct a second equation, and then construct the first equation according to the second equation. The following specifically describes a decoding apparatus in an embodiment of the present invention. Referring to FIG. 2, another embodiment of the decoding apparatus in the embodiments of the present invention includes:

a first acquiring module 201, configured to acquire an encoded packet that has passed through an erasure channel;

a first extracting module 202, configured to extract a non-erased original packet from the encoded packet that is acquired by the first acquiring module 201;

a parsing module 203, configured to obtain an erased original packet by parsing according to a first equation, where the first equation is an equation indicating a correspondence between the erased original packet and the encoded packet that is acquired by the first acquiring module 201, and the first equation includes F unknown variables, where F is a quantity of erased original packets in a complete encoded packet set, and the unknown variables are used to indicate the erased original packets; and a combining module 204, configured to combine the non-erased original packet that is extracted by the first extracting module 202 and the erased original packet that is obtained by the parsing module 203 by parsing to obtain a complete original packet set.

In this embodiment, the decoding apparatus further includes:

a first constructing module 205, configured to construct a second equation, where the second equation is an equation indicating a correspondence between an original packet and an encoded packet;

a second acquiring module 206, configured to acquire a first matrix P from the second equation that is constructed by the first constructing module 205, where the first matrix P is associated with the erased original packet;

a second extracting module 207, configured to extract, from a first vector $\overset{\omega}{Y}_{NonSys}$ indicates an encoded packet set and that is in the second equation constructed by the first constructing module 205, an encoded packet corresponding to the first matrix P to form a second vector $\overset{\omega}{Y'}$; and a second constructing module 208, configured to construct the first equation according to the second equation constructed by the first constructing module 205, the first matrix P acquired by the second acquiring module 206, and the second vector $\overset{\omega}{Y'}$ extracted by the second extracting module 207.

The first extracting module 202 may be specifically configured to extract the non-erased original packet from a sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix},$$

indicating the complete encoded packet set, where the first K encoded packets of the sixth vector $\overset{\omega}{Y}$ constitute a third vector $\overset{\omega}{M}$, and K is a quantity of original packets in the third vector $\overset{\omega}{M}$.

The first constructing module 205 may be specifically configured to construct the second equation $C * \overset{\omega}{D} = \overset{\omega}{Y}_{NonSys}$, where the first (S+H) elements of a seventh vector $\overset{\omega}{D}$ are zero, and a vector constituted by the last K elements is the third vector $\overset{\omega}{M}$, that is $$\overset{\varpi}{D} = \begin{bmatrix} 0 \\ M \\ 0 \\ m_1 \\ M \\ m_K \end{bmatrix};$$

and the first vector $$\overset{\varpi}{Y}_{NonSys} = \begin{bmatrix} y_{K+1} \\ y_{K+2} \\ M \\ y_N \end{bmatrix}$$

is acquired from the sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, and N is a positive integer that is greater than or equal to K.

The second constructing module 208 may be specifically configured to construct the first equation: $P * \overset{\omega}{M} = \overset{\omega}{Y'}$.

In this embodiment of the present invention, a first constructing module 205 first constructs a second equation indicating a correspondence between an original packet and an encoded packet; a second acquiring module 206 acquires a first matrix P from a preset matrix in the second equation; a second extracting module 207 extracts a second vector $\overset{\omega}{Y'}$ from a first vector $\overset{\omega}{Y}_{NonSys}$ that indicates an encoded packet set and that is in the second equation; and then a second constructing module 208 constructs a first equation according to the second equation, the first matrix P, and the second vector $\overset{\omega}{Y'}$, so that the first equation can more accurately indicate a correspondence between an erased original packet and a received encoded packet, and therefore, decoding accuracy is improved.

Figure 3:
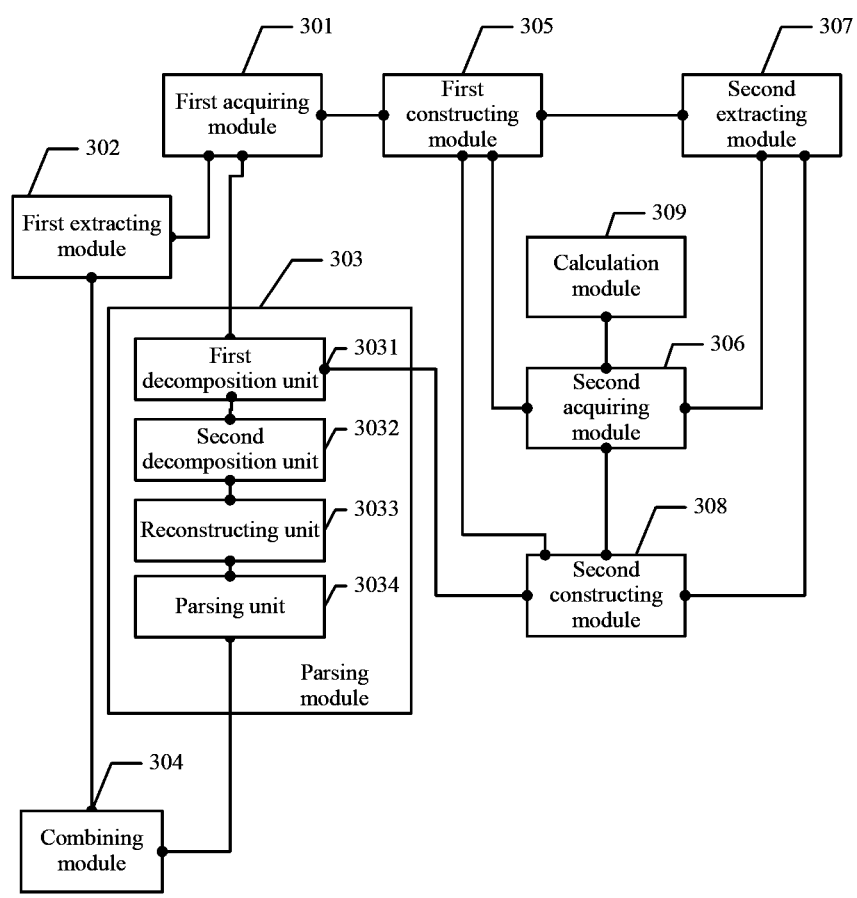
FIG. 3 is another schematic structural diagram of a decoding apparatus in an embodiment of the present invention.

In the foregoing embodiment, the second acquiring module 206 acquires the first matrix P from the second equation. In an actual application, the decoding apparatus may first calculate a second matrix C according to a preset matrix used during encoding and decoding, and then construct the first matrix P from the second matrix C according to a preset rule. In addition, a parsing module 203 obtains an erased original packet by parsing according to the first equation. In an actual application, the parsing module 203 may first decompose each vector in the first equation, and then perform subsequent processing. The following describes a decoding apparatus in an embodiment of the present invention in detail. Referring to FIG. 3, another embodiment of the decoding apparatus in the embodiments of the present invention includes:

a first acquiring module 301, configured to acquire an encoded packet that has passed through an erasure channel;

a first extracting module 302, configured to extract a non-erased original packet from the encoded packet that is acquired by the first acquiring module 301;

a parsing module 303, configured to obtain an erased original packet by parsing according to a first equation, where the first equation is an equation indicating a correspondence between the erased original packet and the encoded packet that is acquired by the first acquiring module 301, and the first equation includes F unknown variables, where F is a quantity of erased original packets in a complete encoded packet set, and the unknown variables are used to indicate the erased original packets; and a combining module 304, configured to combine the non-erased original packet that is extracted by the first extracting module 302 and the erased original packet that is obtained by the parsing module 303 by parsing to obtain a complete original packet set.

The decoding apparatus further includes:

a first constructing module 305, configured to construct a second equation, where the second equation is an equation indicating a correspondence between an original packet and an encoded packet;

a second acquiring module 306, configured to acquire a first matrix P from the second equation that is constructed by the first constructing module 305, where the first matrix P is associated with the erased original packet;

a second extracting module 307, configured to extract, from a first vector $\overset{\omega}{Y}_{NonSys}$ indicates an encoded packet set and that is in the second equation constructed by the first constructing module 305, an encoded packet corresponding to the first matrix P to form a second vector $\overset{\omega}{Y'}$; and a second constructing module 308, configured to construct the first equation according to the second equation constructed by the first constructing module 305, the first matrix P acquired by the second acquiring module 306, and the second vector $\overset{\omega}{Y'}$ extracted by the second extracting module 307.

The first extracting module 302 may be specifically configured to extract the non-erased original packet from a sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix}$$

indicating the complete encoded packet set, where the first K encoded packets of the sixth vector $\overset{u}{Y}$ constitute the third vector $\overset{\omega}{M}$, and K is a quantity of original packets in the third vector $\overset{\omega}{M}$.

The first constructing module 305 may be specifically configured to construct the second equation $C * \overset{\omega}{D} = \overset{u}{Y}_{NonSys}$, where the first (S+H) elements of a seventh vector $\overset{\omega}{D}$ are zero, and a vector constituted by the last K elements is the third vector $\overset{\omega}{M}$, that is $$\overset{\varpi}{D} = \begin{bmatrix} 0 \\ M \\ 0 \\ m_1 \\ M \\ m_K \end{bmatrix};$$

and the first vector $$\overset{\varpi}{Y}_{NonSys} = \begin{bmatrix} y_{K+1} \\ y_{K+2} \\ M \\ y_N \end{bmatrix}$$

is acquired from the sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, and N is a positive integer that is greater than or equal to K.

The second constructing module 308 may be specifically configured to construct the first equation: $P * \overset{\omega}{M} = \overset{\omega}{Y}$.

In this embodiment, the decoding apparatus further includes:

a calculation module 309, configured to calculate a second matrix C according to a preset matrix used during encoding and decoding; and the second acquiring module 306 is specifically configured to construct, according to a preset rule, the first matrix P from the second matrix C that is calculated by the calculation module 309.

The parsing module 303 specifically includes:

a first decomposition unit 3031, configured to decompose the third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$, where the fourth vector $\overset{\omega}{M}_{Ers}$ indicates the erased original packet set, and the fifth vector $\overset{\omega}{M}_{Rcv}$ indicates the non-erased original packet set;

a second decomposition unit 3032, configured to perform decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$;

a reconstructing unit 3033, configured to reconstruct the first equation according to the fourth vector $\overset{\omega}{M}_{Ers}$ and the fifth vector $\overset{\omega}{M}_{Rcv}$ that are obtained by means of decomposition by the first decomposition unit 3031 and the third matrix $P_{Ers}$ and the fourth matrix $P_{Rcv}$ that are obtained by means of decomposition by the second decomposition unit 3032, to obtain a third equation; and a parsing unit 3034, configured to parse the third equation that is obtained by means of reconstruction by the reconstructing unit 3033 to obtain a value of an unknown variable in the fourth vector $\overset{\omega}{M}_{Ers}$.

The calculation module 309 may be specifically configured to calculate the second matrix C according to a preset equation $C = J * A^{-1} = [C_1, C_2]$, where a fifth matrix $A^{-1}$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C.

The second acquiring module 306 may be specifically configured to select (F+ε) row or vectors from the ninth matrix $C_2$ according to a preset rule to form the first matrix $$P = \begin{bmatrix} \overset{\varpi}{p}_{r_1} \\ \overset{\varpi}{p}_{r_2} \\ M \\ \overset{\varpi}{p}_{r_{F+\varepsilon}} \end{bmatrix},$$

where ε is a preset value, and the preset rule is as follows:

(1) in the row vector, not all F elements corresponding to F erased original packets in the third vector $\overset{\omega}{M}$ are zero; and (2) an encoded packet, in the first vector $\overset{\omega}{Y}_{NonSys}$, corresponding to the row vector is not erased; and correspondence between the row vector and the third vector $\overset{\omega}{M}$, and correspondence between the row vector and the first vector $\overset{u}{Y}_{NonSys}$ are obtained according to the second equation.

The second extracting module 307 may be specifically configured to extract, from the first vector $\vec{Y}_{NonSys}$, an encoded packet corresponding to (F+ε) row vector or vectors in the first matrix P to form the second vector $\vec{Y'}=[y_{K+r_1}, y_{K+r_2}, \Lambda y_{K+r_{F+\varepsilon}}]^T$.

The first decomposition unit 3031 may be specifically configured to displace the F erased original packets in the third vector $\vec{M}$ to the first F locations to form an eighth vector $$\vec{M'} = \begin{bmatrix} (\vec{M}_{Ers})^T \\ (\vec{M}_{Rcv})^T \end{bmatrix} = \begin{bmatrix} m_{e_1} \\ m_{e_2} \\ M \\ m_{e_F} \\ (\vec{M}_{Rcv})^T \end{bmatrix};$$

The second decomposition unit 3032 may be specifically configured to perform displacement, corresponding to the eighth vector $\vec{M'}$, on the first matrix P to obtain a tenth matrix P'=[$P_{Ers}, P_{Rcv}$], where each column in the third matrix $P_{Ers}$ is corresponding to an erased original packet in the fourth vector $\vec{M}_{Ers}$, and each column in the fourth matrix $P_{Rcv}$ is corresponding to a non-erased original packet in the fifth vector $\vec{M}_{Rcv}$.

The reconstructing unit 3033 may be specifically configured to transform the first equation $P* \vec{M} = \vec{Y'}$ into the third equation $P_{Ers}*(\vec{M}_{Ers})^T = \vec{Y'} - P_{Rcv}*(\vec{M}_{Rcv})^T$.

The combining module 304 may be specifically configured to combine the fifth vector $\vec{M}_{Rcv}$ indicating the non-erased original packet set and the fourth vector $\vec{M}_{Ers}$ that is obtained by the parsing unit 3034 by parsing and that indicates the erased original packet set to obtain the complete original packet set.

In this embodiment of the present invention, a first decomposition unit 3031 first performs displacement on a third vector $\vec{M}$ in a first equation to obtain a fourth vector $\vec{M}_{Ers}$ and a fifth vector $\vec{M}_{Rcv}$; a second decomposition unit 3032 performs displacement, corresponding to the fourth vector $\vec{M}_{Ers}$ and the fifth vector $\vec{M}_{Rcv}$, on a first matrix P to obtain a third matrix $P_{Ers}$ and a fourth matrix $P_{Rcv}$; and a reconstructing unit 3033 transforms the first equation into a third equation according to these vectors, so that only the fourth vector $\vec{M}_{Ers}$ in the third equation is an unknown variable, which simplifies an equation parsing process, reduces time for parsing the first equation, and increases a decoding rate.

It can be understood that the decoding apparatus may be applied in a communication scenario, for example, in a base station, a terminal device, or a relay node Relay. When a transmit end is located in a base station or in a Relay, the decoding apparatus may be located in a terminal device. When the transmit end is located in a terminal device, the decoding apparatus may be located in a base station or in a Relay. In this case, the decoding apparatus may receive an encoded packet transmitted by the transmit end. The decoding apparatus may also be applied in a storage system together with an encoding apparatus, and is configured to correct, delete, and restore a damaged storage unit in the storage system. When some of encoded packets stored in the storage system are erased, a first acquiring module may acquire these encoded packets that have undergone erasing. The decoding apparatus may also be applied in other application scenarios, which is not limited herein.

Figure 4:
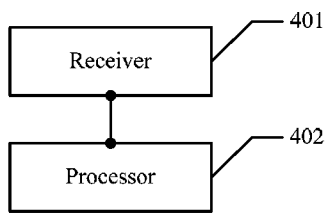
FIG. 4 is another schematic structural diagram of a decoding apparatus in an embodiment of the present invention.

The foregoing describes the decoding apparatus in this embodiment of the present invention from a perspective of a unitized functional entity. The following describes a decoding apparatus in an embodiment of the present invention from a perspective of hardware processing. Referring to FIG. 4, another embodiment of the decoding apparatus in the embodiments of the present invention includes:

a receiver 401, configured to receive an encoded packet that is transmitted by a transmit end; and a processor 402, configured to perform the following operations:

extracting a non-erased original packet from the encoded packet received by the receiver 401;

obtaining an erased original packet by parsing according to a first equation, where the first equation is an equation indicating a correspondence between the erased original packet and the received encoded packet, and the first equation includes F unknown variables, where F is a quantity of erased original packets in a complete encoded packet set, and the unknown variables are used to indicate the erased original packets; and combining the extracted non-erased original packet and the erased original packet obtained by parsing to obtain a complete original packet set.

In some embodiments of the present invention, the processor 402 is further configured to:

construct a second equation, where the second equation is an equation indicating a correspondence between an original packet and an encoded packet;

acquire a first matrix P from the second equation, where the first matrix P is associated with the erased original packet;

extract, from a first vector $\vec{Y}_{NonSys}$ that indicates an encoded packet set and that is in the second equation, an encoded packet corresponding to the first matrix P to form a second vector $\vec{Y'}$; and construct the first equation according to the second equation, the first matrix P, and the second vector $\vec{Y'}$.

In some embodiments of the present invention, the processor 402 is further configured to calculate a second matrix C according to a preset matrix used during encoding and decoding; and the processor 402 performs the operation of acquiring a first matrix P from the second equation, and is specifically configured to:

construct, according to a preset rule, the first matrix P from the second matrix C that is calculated by the calculation unit.

In some embodiments of the present invention, the processor 402 performs the operation of obtaining an erased original packet by parsing according to a first equation, and is specifically configured to:

decompose a third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$, where the fourth vector $\overset{\omega}{M}_{Ers}$ indicates the erased original packet set, and the fifth vector $\overset{\omega}{M}_{Rcv}$ indicates the non-erased original packet set;

perform decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$;

reconstruct the first equation according to the fourth vector $\overset{\omega}{M}_{Ers}$, the fifth vector $\overset{\omega}{M}_{Rcv}$, the third matrix $P_{Ers}$, and the fourth matrix $P_{Rcv}$, to obtain a third equation; and parse the third equation to obtain a value of an unknown variable in the fourth vector $\overset{\omega}{M}_{Ers}$.

In some embodiments of the present invention, the processor 402 performs the operation of extracting a non-erased original packet from the encoded packet received by the receiver, and is specifically configured to extract the non-erased original packet from a sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix}$$

indicating the complete encoded packet set, where the first K encoded packets of the sixth vector $\overset{u}{Y}$ constitute the third vector $\overset{\omega}{M}$, and K is a quantity of original packets in the third vector $\overset{\omega}{M}$.

In some embodiments of the present invention, the processor 402 performs the operation of constructing the second equation, and is specifically configured to construct the second equation $C * \overset{\omega}{D} = \overset{u}{Y}_{NonSys}$, where the first (S+H) elements of a seventh vector $\overset{\omega}{D}$ are zero, and a vector constituted by the last K elements is the third vector $\overset{\omega}{M}$, that is $$\overset{\varpi}{D} = \begin{bmatrix} 0 \\ M \\ 0 \\ m_1 \\ M \\ m_K \end{bmatrix}; \text{ and } \overset{\varpi}{Y}_{NonSys} = \begin{bmatrix} y_{K+1} \\ y_{K+2} \\ M \\ y_N \end{bmatrix}$$

is acquired from the sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, and N is a positive integer that is greater than or equal to K.

In some embodiments of the present invention, the processor 402 performs the operation of calculating a second matrix C according to a preset matrix used during encoding and decoding, and is specifically configured to:

calculate the second matrix C according to a preset equation $C = J * A^{-1} = [C_1, C_2]$, where a fifth matrix $A^{-1}$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C.

In some embodiments of the present invention, the processor 402 performs the operation of constructing, according to a preset rule, the first matrix P from the second matrix C that is calculated by the calculation unit, and is specifically configured to:

select (F+ε) row vector or vectors from the ninth matrix $C_2$ according to a preset rule to form the first matrix $$P = \begin{bmatrix} \overset{\varpi}{p}_{r_1} \\ \overset{\varpi}{p}_{r_2} \\ M \\ \overset{\varpi}{p}_{r_{F+\varepsilon}} \end{bmatrix},$$

where ε is a preset value, and the preset rule is as follows:

(1) in the row vector, not all F elements corresponding to F erased original packets in the third vector $\overset{\omega}{M}$ are zero; and (2) an encoded packet, in the first vector $\overset{\omega}{Y}_{NonSys}$, corresponding to the row vector is not erased; and correspondence between the row vector and the third vector $\overset{\omega}{M}$, and correspondence between the row vector and the first vector $\overset{u}{Y}_{NonSys}$ are obtained according to the second equation.

In some embodiments of the present invention, the processor 402 performs the operation of extracting, from a first vector $\overset{u}{Y}_{NonSys}$ that indicates an encoded packet set and that is in the second equation, an encoded packet corresponding to the first matrix P to form a second vector $\overset{\omega}{Y'}$, and is specifically configured to extract, from the first vector $\overset{u}{Y}_{NonSys}$, an encoded packet corresponding to (F+ε) row vector or vectors in the first matrix P to form the second vector $\overset{\omega}{Y'} = [y_{K+r_1}, y_{K+r_2} \Lambda y_{K+r_{F+\varepsilon}}]^T$.

In some embodiments of the present invention, the processor 402 performs the operation of constructing the first equation, according to the second equation, the first matrix P, and the second vector $\overset{\omega}{Y'}$, and is specifically configured to construct the first equation: $P * \overset{\omega}{M} = \overset{\omega}{Y'}$.

In some embodiments of the present invention, the processor 402 performs the operation of decomposing a third vector $\overset{\omega}{M}$ that indicates the complete original packet set and that is in the first equation into a fourth vector $\overset{\omega}{M}_{Ers}$ and a fifth vector $\overset{\omega}{M}_{Rcv}$, and is specifically configured to:

displace the F erased original packets in the third vector $\overset{\omega}{M}$ to the first F locations to form an eighth vector $$\overset{\omega}{M'} = \begin{bmatrix} \left(\overset{\omega}{M}_{Ers}\right)^T \\ \left(\overset{\omega}{M}_{Rcv}\right)^T \end{bmatrix} = \begin{bmatrix} m_{e_1} \\ m_{e_2} \\ M \\ m_{e_F} \\ \left(\overset{\omega}{M}_{Rcv}\right)^T \end{bmatrix}.$$

In some embodiments of the present invention, the processor 402 performs the operation of performing decomposition, corresponding to the fourth vector $\overset{\omega}{M}_{Ers}$ and the fifth vector $\overset{\omega}{M}_{Rcv}$, on the first matrix P in the first equation to obtain a third matrix $P_{Ers}$ and a fourth matrix $P_{Rcv}$, and is specifically configured to:

perform displacement, corresponding to the eighth vector $\overset{\omega}{M'}$, on the first matrix P to obtain a tenth matrix $P'=[P_{Ers}, P_{Rcv}]$, where each column in the third matrix $P_{Ers}$ is corresponding to an erased original packet in the fourth vector $\overset{\omega}{M}_{Ers}$, and each column in the fourth matrix $P_{Rcv}$ is corresponding to a non-erased original packet in the fifth vector $\overset{\omega}{M}_{Rcv}$.

In some embodiments of the present invention, the processor 402 performs the operation of reconstructing the first equation according to the fourth vector $\overset{\omega}{M}_{Ers}$, and the fifth vector $\overset{\omega}{M}_{Rcv}$, the third matrix $P_{Ers}$, and the fourth matrix $P_{Rcv}$ to obtain a third equation, and is specifically configured to:

transform the first equation $P * \overset{\omega}{M} = \overset{\omega}{Y'}$ into the third equation $P_{Ers} * (\overset{\omega}{M}_{Ers})^T = \overset{\omega}{Y'} - P_{Rcv} * (\overset{\omega}{M}_{Rcv})^T$.

In some embodiments of the present invention, the processor 402 performs the operation of combining the extracted non-erased original packet and the erased original packet obtained by parsing to obtain a complete original packet set, and is specifically configured to:

combine the fifth vector $\overset{\omega}{M}_{Rcv}$ indicating the non-erased original packet set and the fourth vector $\overset{\omega}{M}_{Ers}$ that is obtained by parsing and that indicates the erased original packet set to obtain the complete original packet set.

It can be understood that the operations performed by the processor 402 may be implemented by means of hardware, or may be implemented by the processor by invoking software, which is not limited herein.

Figure 5:
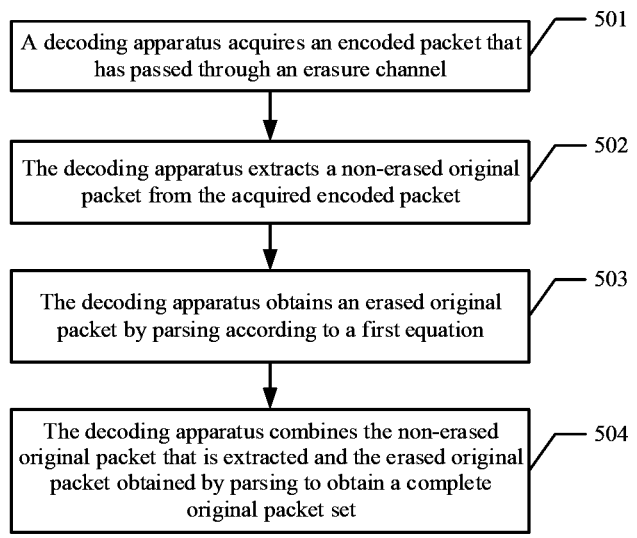
FIG. 5 is a schematic flowchart of a systematic code decoding method in an embodiment of the present invention.

The following describes a systematic code decoding method in an embodiment of the present invention. Referring to FIG. 5, an embodiment of the systematic code decoding method in the embodiments of the present invention includes:

501. A decoding apparatus acquires an encoded packet that has passed through an erasure channel.

After an encoder obtains an encoded packet by encoding an original packet, due to some reasons such as transmission or damage, some encoded packets may be erased, and the decoding apparatus acquires an encoded packet that has passed through the erasure channel.

It can be understood that after acquiring encoded packets one by one, the decoding apparatus may form an encoded packet set with multiple encoded packets.

A definition of the erasure channel is similar to that in the embodiment shown in FIG. 1, and details are not described herein again.

502. The decoding apparatus extracts a non-erased original packet from the acquired encoded packet.

After acquiring the encoded packet that has passed through the erasure channel, the decoding apparatus extracts the non-erased original packet from the acquired encoded packet.

After the decoding apparatus acquires all encoded packets and forms an encoded packet set with all the acquired encoded packets, the decoding apparatus may extract all non-erased original packets from the encoded packet set. When acquiring the encoded packets, the decoding apparatus may also directly determine whether an encoded packet is a non-erased original packet. If it is determined that the encoded packet is a non-erased original packet, the non-erased original packet is extracted, which is not limited herein.

Due to a feature of systematic code encoding, a complete encoded packet set includes a complete original packet set, where the complete encoded packet set is a set of all encoded packets that are obtained by encoding original packets, and the complete original packet set is a set of all original packets corresponding to the complete encoded packets. Because some encoded packets may be lost in a transmission process or a storage process of encoded packets, some encoded packets of a complete encoded packet set that is acquired by the decoding apparatus may be erased. The erased part may also be some encoded packets in a same part of the complete encoded packet set and the complete original packet set. These non-erased encoded packets in the same part of the complete encoded packet set and the complete original packet set are referred to as non-erased original packets, and an erased encoded packet in the same part of the complete encoded packet set and the complete original packet set is referred to as an erased original packet.

503. The decoding apparatus obtains an erased original packet by parsing according to a first equation.

After acquiring the encoded packet that has passed through the erasure channel, the decoding apparatus obtains the erased original packet by parsing according to the first equation, where the first equation is an equation indicating a correspondence between the erased original packet and the acquired encoded packet, and the first equation includes F unknown variables, where F is a quantity of erased original packets in a complete encoded packet set, and the unknown variables are used to indicate the erased original packets in the complete encoded packet set.

504. The decoding apparatus combines the extracted non-erased original packet and the erased original packet obtained by parsing to obtain a complete original packet set.

After extracting the non-erased original packet from the acquired encoded packet and obtaining the erased original packet by parsing according to the first equation, the decoding apparatus combines the extracted non-erased original packet and the erased original packet obtained by parsing to obtain the complete original packet set.

In this embodiment of the present invention, a decoding apparatus first extracts a non-erased original packet from an acquired encoded packet that has passed through an erasure channel; and then by using the erased original packet as an unknown variable, obtains an erased original packet by parsing according to a first equation, where the first equation is an equation indicating a correspondence between the erased original packet and the acquired encoded packet. Because a quantity F of erased original packets is far less than a total quantity K of original packets, a dimension of the first equation that includes F unknown variables is far lower than a dimension of an equation indicating a correspondence between an encoded packet and an intermediate packet. An operation amount required for parsing the relatively low-dimensional first equation is far smaller than that for parsing the quite high-dimensional equation indicating the correspondence between an encoded packet and an intermediate packet, thereby greatly reducing an operation amount required for decoding. For example, when K is 1024 and a packet erasure ratio (Erasure Ratio) is 5%, by using this decoding method, only approximately 22 minutes are required for decoding for 10,000 times by using a decoding program of Matlab (Matlab) of a common PC, which greatly reduces time required for decoding and improves decoding efficiency.

Figure 6:
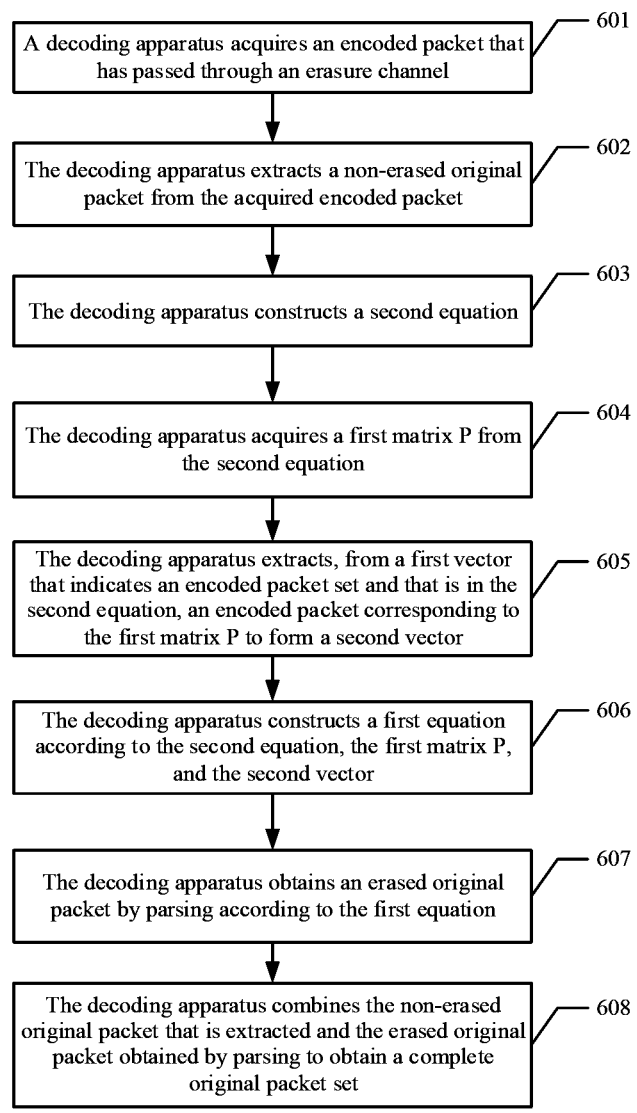
FIG. 6 is another schematic flowchart of a systematic code decoding method in an embodiment of the present invention.

In the foregoing embodiment, the decoding apparatus obtains the erased original packet by parsing according to the first equation. In an actual application, the decoding apparatus may first construct a second equation, and then construct the first equation according to the second equation. The following describes a systematic code decoding method in an embodiment of the present invention in detail. Referring to FIG. 6, another embodiment of the systematic code decoding method in the embodiments of the present invention includes:

601. A decoding apparatus acquires an encoded packet that has passed through an erasure channel.

After an encoder obtains an encoded packet by encoding an original packet, due to some reasons such as transmission or damage, some encoded packets may be erased, and the decoding apparatus acquires an encoded packet that has passed through the erasure channel.

A definition of the erasure channel is similar to that in the embodiment shown in FIG. 1, and details are not described herein again.

After acquiring, one by one, encoded packets that have passed through an erasure channel, a decoding apparatus may form an encoded packet set with all acquired encoded packets. For example, 100 original packets are encoded to generate 110 encoded packets by means of systematic Raptor code encoding and sent. After the 110 encoded packets pass through the erasure channel, the $10^{th}$ encoded packet, the $13^{th}$ encoded packet, and the $102^{nd}$ encoded packet are erased. The decoding apparatus may combine the 107 acquired encoded packets and the three erased encoded packets to form a complete encoded packet set. It may be regarded that the 100 original packets constitute a complete original packet set, where the three erased encoded packets may be replaced by unknown variables. Due to a feature of systematic Raptor code encoding, the first 100 encoded packets in the complete encoded packet set are the same as the first 100 original packets in the complete original packet set, and therefore, it may be regarded that the $10^{th}$ erased encoded packet and the $13^{th}$ erased encoded packet in the complete encoded packet set are erased original packets in the complete encoded packet set.

602. The decoding apparatus extracts a non-erased original packet from the acquired encoded packet.

After acquiring the encoded packet that has passed through the erasure channel, the decoding apparatus extracts the non-erased original packet from the acquired encoded packet.

Due to a feature of systematic code encoding, a complete encoded packet set includes a complete original packet set, where the complete encoded packet set is a set of all encoded packets that are obtained by encoding original packets, and the complete original packet set is a set of all original packets corresponding to the complete encoded packets. Because some encoded packets may be lost in a transmission process or a storage process of encoded packets, some encoded packets of a complete encoded packet set that is acquired by the decoding apparatus may be erased. The erased part may also be some encoded packets in a same part of the complete encoded packet set and the complete original packet set. These non-erased encoded packets in the same part of the complete encoded packet set and the complete original packet set are referred to as non-erased original packets, and an erased encoded packet in the same part of the complete encoded packet set and the complete original packet set is referred to as an erased original packet.

The decoding apparatus may use a sixth vector $$\overset{\omega}{Y} = \begin{bmatrix} y_1 = m_1 \\ M \\ y_K = m_K \\ y_{K+1} \\ y_{K+2} \\ M \\ y_N \end{bmatrix}$$

indicating a complete encoded packet set to indicate the acquired encoded packet, where an erased encoded packet may be replaced by an unknown variable, and the first K encoded packets of the sixth vector $\overset{\omega}{Y}$ constitute a third vector $\overset{\omega}{M}$ indicating a complete original packet; and the decoding apparatus may extract the non-erased original packet from the sixth vector $\overset{\omega}{Y}$ indicating the complete encoded packet set. For example, $m_i = y_i$, i is greater than or equal to 1 and less than or equal to K, where K is a quantity of original packets in the complete original packet. If $y_i$ is not erased in a transmission process or a storage process, $m_i = y_i$ is a non-erased original packet.

It can be understood that step 602 may be performed on any occasion before step 608, which is not limited herein.

603. The decoding apparatus constructs a second equation.

After acquiring the encoded packet that has passed through the erasure channel, the decoding apparatus constructs the second equation, where the second equation is an equation indicating a correspondence between an original packet and an encoded packet.

The decoding apparatus may construct the second equation $C * \overset{\omega}{D} = \overset{\omega}{Y}_{NonSys}$, where a second matrix C is obtained through calculation according to a preset matrix, the first (S+H) elements of the seventh vector $\overset{\omega}{D}$ are zero, and a vector constituted by the last K elements is the third vector $\overset{\omega}{M}$, that is $$\overset{\varpi}{D} = \begin{bmatrix} 0 \\ M \\ 0 \\ m_1 \\ M \\ m_K \end{bmatrix} ; \text{ and } \overset{\varpi}{Y}_{NonSys} = \begin{bmatrix} y_{K+1} \\ y_{K+2} \\ M \\ y_N \end{bmatrix}$$

is acquired from the sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix},$$

S and H are preset values used during encoding, and N is a positive integer that is greater than or equal to K.

604. The decoding apparatus acquires a first matrix P from the second equation.

After constructing the second equation, the decoding apparatus acquires the first matrix P from the second equation.

605. The decoding apparatus extracts, from a first vector $\overset{\omega}{Y}_{NonSys}$ that indicates an encoded packet set and that is in the second equation, an encoded packet corresponding to the first matrix P to form a second vector $\overset{\omega}{Y'}$.

After acquiring the first matrix P, the decoding apparatus extracts, from the first vector $\overset{\omega}{Y}_{NonSys}$ that indicates the encoded packet set and that is in the second equation, the encoded packet corresponding to the first matrix P to form the second vector $\overset{\omega}{Y'}$.

606. The decoding apparatus constructs a first equation according to the second equation, the first matrix P, and the second vector $\overset{\omega}{Y'}$.

After obtaining the second vector $\overset{\omega}{Y'}$, the decoding apparatus constructs the first equation according to the second equation, the first matrix P, and the second vector $\overset{\omega}{Y'}$ The decoding apparatus may construct the first equation: $P * \overset{\omega}{M} = \overset{\omega}{Y'}$.

607. The decoding apparatus obtains an erased original packet by parsing according to the first equation.

After acquiring the encoded packet that has passed through the erasure channel, the decoding apparatus obtains the erased original packet by parsing according to the first equation, where the first equation is an equation indicating a correspondence between the erased original packet and the acquired encoded packet, and the first equation includes F unknown variables, where F is a quantity of erased original packets in a complete encoded packet set, and the unknown variables are used to indicate the erased original packets in the complete encoded packet.

608. The decoding apparatus combines the extracted non-erased original packet and the erased original packet obtained by parsing to obtain a complete original packet set.

After extracting the non-erased original packet from the acquired encoded packet and obtaining the erased original packet by parsing according to the first equation, the decoding apparatus combines the extracted non-erased original packet and the erased original packet obtained by parsing to obtain the complete original packet set.

In this embodiment of the present invention, a decoding apparatus first constructs a second equation indicating a correspondence between an original packet and an encoded packet, acquires a first matrix P from the second equation, extracts a second vector $\overset{\omega}{Y'}$ from a first vector $\overset{u}{Y}_{NonSys}$ that indicates an encoded packet set and that is in the second equation, and constructs a first equation according to the second equation, the first matrix P, and the second vector $\overset{\omega}{Y'}$, so that the first equation can indicate a correspondence between an erased original packet and an acquired encoded packet.

Figure 7:
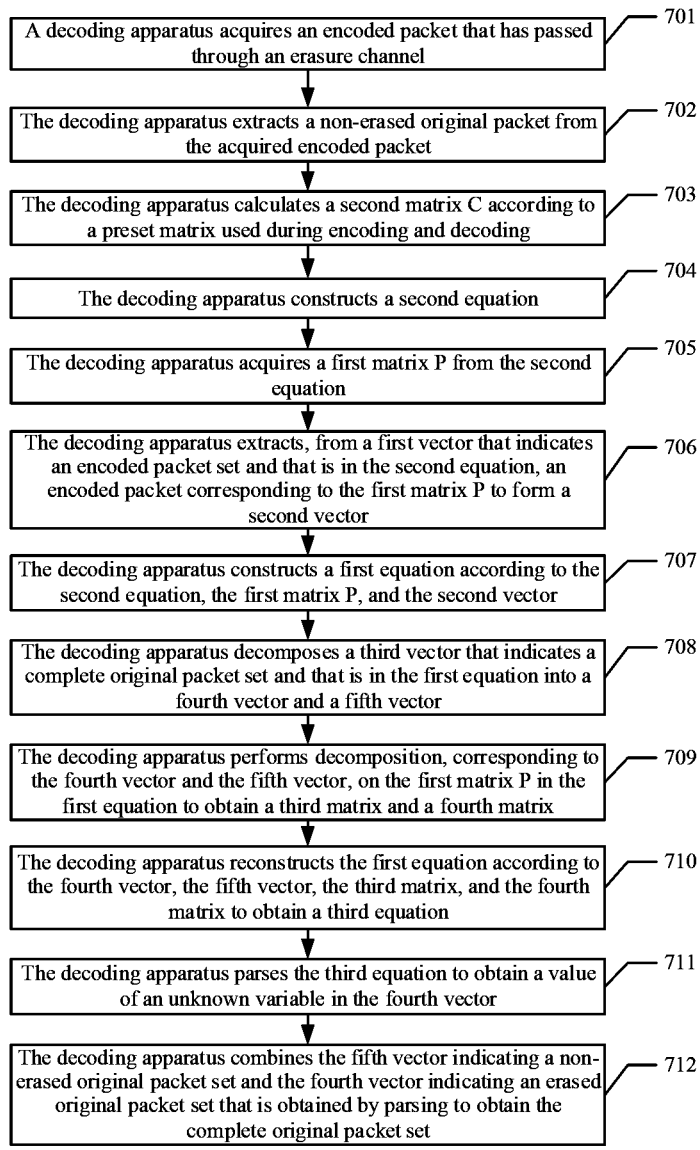
FIG. 7 is another schematic flowchart of a systematic code decoding method in an embodiment of the present invention.

In the foregoing embodiment, the decoding apparatus acquires the first matrix P from the second equation. In an actual application, the decoding apparatus may first calculate a second matrix C according to a preset matrix used during encoding and decoding, and then construct the first matrix P from the second matrix C according to a preset rule. In addition, the decoding apparatus obtains an erased original packet by parsing according to the first equation. In an actual application, the decoding apparatus may first decompose each vector in the first equation, and then perform subsequent processing. The following describes a systematic code decoding method in an embodiment of the present invention in detail. Referring to FIG. 7, another embodiment of the systematic code decoding method in the embodiments of the present invention includes:

701. A decoding apparatus acquires an encoded packet that has passed through an erasure channel.

After an encoder obtains an encoded packet by encoding an original packet, due to some reasons such as transmission or damage, some encoded packets may be erased, and the decoding apparatus acquires an encoded packet that has passed through the erasure channel.

A definition of the erasure channel is similar to that in the embodiment shown in FIG. 1, and details are not described herein again.

702. The decoding apparatus extracts a non-erased original packet from the acquired encoded packet.

After acquiring the encoded packet that has passed through the erasure channel, the decoding apparatus extracts the non-erased original packet from the acquired encoded packet.

Due to a feature of systematic code encoding, a complete encoded packet set includes a complete original packet set, where the complete encoded packet is a set of all encoded packets that are obtained by encoding original packets, and the complete original packet set is a set of all original packets corresponding to the complete encoded packets. Because some encoded packets may be lost in a transmission process or a storage process of encoded packets, some encoded packets of a complete encoded packet set that is acquired by the decoding apparatus may be erased. The erased part may also be some encoded packets in a same part of the complete encoded packet set and the complete original packet set. These non-erased encoded packets in the same part of the complete encoded packet set and the complete original packet set are referred to as non-erased original packets, and an erased encoded packet in the same part of the complete encoded packet set and the complete original packet set is referred to as an erased original packet.

The decoding apparatus may use a sixth vector $$\overset{\varpi}{Y} = \begin{bmatrix} y_1 = m_1 \\ M \\ y_K = m_K \\ y_{K+1} \\ y_{K+2} \\ M \\ y_N \end{bmatrix}$$

indicating a complete encoded packet set to indicate the acquired encoded packet, where an erased encoded packet may be replaced by an unknown variable, and the first K encoded packets of the sixth vector $\overset{\omega}{Y}$ constitute a third vector $\overset{\omega}{M}$ indicating a complete original packet; and the decoding apparatus may extract the non-erased original packet from the sixth vector $\overset{\omega}{Y}$ indicating the complete encoded packet set. For example, $m_i=y_i$, i is greater than or equal to 1 and less than or equal to K, where K is a quantity of original packets in the complete original packet. If $y_i$ is not erased in a transmission process or a storage process, $m_i=y_i$ is a non-erased original packet.

It can be understood that step 702 may be performed on any occasion before step 712, which is not limited herein.

703. The decoding apparatus calculates a second matrix C according to a preset matrix used during encoding and decoding.

The decoding apparatus calculates the second matrix C according to the preset matrix used during encoding and decoding. In an actual application, the second matrix C may also be calculated in advance and stored in the decoding apparatus, which is not limited herein.

The decoding apparatus may calculate the second matrix C according to a preset equation $C=J*A^{-1}=[C_1, C_2]$, where a fifth matrix $A^{-1}$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C.

704. The decoding apparatus constructs a second equation.

After acquiring the encoded packet that has passed through the erasure channel, the decoding apparatus constructs the second equation, where the second equation is an equation indicating a correspondence between an original packet and an encoded packet.

The decoding apparatus may construct the second equation $C*\overset{\omega}{D}=\overset{\omega}{Y}_{NonSys}$, where the first (S+H) elements of the seventh vector $\overset{\omega}{D}$ are zero, and a vector constituted by the last K elements is the third vector $\overset{\omega}{M}$, that is $$\overset{\varpi}{D} = \begin{bmatrix} 0 \\ M \\ 0 \\ m_1 \\ M \\ m_K \end{bmatrix}; \text{and } \overset{\varpi}{Y}_{NonSys} = \begin{bmatrix} y_{K+1} \\ y_{K+2} \\ M \\ y_N \end{bmatrix}$$

is acquired from the sixth vector $$\overset{\varpi}{Y}_{NonSys} = \begin{bmatrix} y_{K+1} \\ y_{K+2} \\ M \\ y_N \end{bmatrix},$$

S and H are preset values used during encoding, and N is a positive integer that is greater than or equal to K.

705. The decoding apparatus constructs a first matrix P from the second matrix C according to a preset rule.

After obtaining the second matrix C, the decoding apparatus constructs the first matrix P from the second matrix C according to the preset rule.

The decoding apparatus may select (F+ε) row vector or vectors from the ninth matrix $C_2$ according to a preset rule to form the first matrix $$P = \begin{bmatrix} \overset{\varpi}{p}_{r_1} \\ \overset{\varpi}{p}_{r_2} \\ M \\ \overset{\varpi}{p}_{r_{F+\varepsilon}} \end{bmatrix},$$

where ε is a preset value, and the preset rule is as follows:

(1) in the row vector, not all F elements corresponding to F erased original packets in the third vector $\overset{\omega}{M}$ are zero; and (2) an encoded packet, in the first vector $\overset{\omega}{Y}$, corresponding to the row vector is not erased; and a correspondence between the $r^{th}$ row vector $\overset{\varpi}{p} = \{p_{r,1}, p_{r,2} \Lambda p_{r,K}\}$ in the ninth matrix $C_2$ and the third vector $\overset{\omega}{M}$ is: the $i^{th}$ element $m_i$ in the third vector $\overset{\omega}{M}$ is corresponding to an element $p_{r,i}$ in the row vector $\overset{\varpi}{p} = \{p_{r,1}, p_{r,2} \Lambda p_{r,K}\}$; and a correspondence between the $r^{th}$ row vector $\overset{\varpi}{p} = \{p_{r,1}, p_{r,2} \Lambda p_{r,K}\}$ in the ninth matrix $C_2$ and a corresponding encoded packet in the first vector $\overset{\omega}{M}$ is: $\overset{\varpi}{p} = \{p_{r,1}, p_{r,2} \Lambda p_{r,K}\}$ is corresponding to an encoded packet $y_{K+r}$.

The preset value ε is an empirical value, may be preset, or may be defined according to a quantity of erased original packets, which is not limited herein.

It can be understood that if the decoding apparatus selects less than (F+ε) row vector or vectors from the ninth matrix $C_2$, the decoding apparatus may stop decoding, and report a decoding failure.

706. The decoding apparatus extracts, from a first vector $\overset{\omega}{Y}_{NonSys}$ that indicates an encoded packet set and that is in the second equation, an encoded packet corresponding to the first matrix P to form a second vector $\vec{Y'}$.

After acquiring the first matrix P, the decoding apparatus extracts, from the first vector $\vec{Y}_{NonSys}$ that indicates the encoded packet set and that is in the second equation, the encoded packet corresponding to the first matrix P to form the second vector $\vec{Y'}$.

The decoding apparatus may extract, from the first vector $\vec{Y}_{NonSys}$, an encoded packet corresponding to (F+ε) row vector or vectors in the first matrix P to form the second vector $\vec{Y'} = [y_{K+r_1}, y_{K+r_2} \Lambda y_{K+r_{F+\varepsilon}}]^T$.

707. The decoding apparatus constructs a first equation according to the second equation, the first matrix P, and the second vector $\vec{Y'}$.

After obtaining the second vector $\vec{Y'}$, the decoding apparatus constructs the first equation according to the second equation, the first matrix P, and the second vector $\vec{Y'}$.

The decoding apparatus may construct the first equation: $P * \vec{M} = \vec{Y'}$.

708. The decoding apparatus decomposes a third vector $\vec{M}$ that indicates a complete original packet set and that is in the first equation into a fourth vector $\vec{M}_{Ers}$ and a fifth vector $\vec{M}_{Rcv}$.

After constructing the first equation, the decoding apparatus decomposes the third vector $\vec{M}$ that indicates the complete original packet set and that is in the first equation into the fourth vector $\vec{M}_{Ers}$ and the fifth vector $\vec{M}_{Rcv}$.

The decoding apparatus may displace the F erased original packets in the third vector $\vec{M}$ to the first F locations to form an eighth vector $$\vec{M'} = \begin{bmatrix} (\vec{M}_{Ers})^T \\ (\vec{M}_{Rev})^T \end{bmatrix} = \begin{bmatrix} m_{e_1} \\ m_{e_2} \\ M \\ m_{e_F} \\ (\vec{M}_{Rev})^T \end{bmatrix}.$$

709. The decoding apparatus performs decomposition, corresponding to the fourth vector $\vec{M}_{Ers}$ and the fifth vector $\vec{M}_{Rcv}$, on the first matrix P in the first equation to obtain a third matrix $P_{Ers}$ and a fourth matrix $P_{Rcv}$.

After decomposing the third vector $\vec{M}$ that indicates the complete original packet set and that is in the first equation into the fourth vector $\vec{M}_{Ers}$ and the fifth vector $\vec{M}_{Rcv}$, the decoding apparatus performs decomposition, corresponding to the fourth vector $\vec{M}_{Ers}$ and the fifth vector $\vec{M}_{Rcv}$, on the first matrix P in the first equation to obtain the third matrix $P_{Ers}$ and the fourth matrix $P_{Rcv}$, a correspondence thereof is: the i$^{th}$ column of the matrix P is corresponding to the i$^{th}$ element $m_i$ of the vector $\vec{M}$.

The decoding apparatus may perform displacement, corresponding to the eighth vector $\vec{M'}$, on the first matrix P to obtain a tenth matrix $P' = [P_{Ers}, R_{Rcv}]$, where each column in the third matrix $P_{Ers}$ is corresponding to an erased original packet in the fourth vector $\vec{M}_{Ers}$, and each column in the fourth matrix $P_{Rcv}$ is corresponding to a non-erased original packet in the fifth vector $\Lambda_{Rcv}$.

710. The decoding apparatus reconstructs the first equation according to the fourth vector $\vec{M}_{Ers}$, the fifth vector $\vec{M}_{Rcv}$, the third matrix $P_{Ers}$, and the fourth matrix $P_{Rcv}$, to obtain a third equation.

After obtaining the third matrix $P_{Ers}$ and the fourth matrix $P_{Rcv}$, the decoding apparatus reconstructs the first equation according to the fourth vector $\vec{M}_{Ers}$, the fifth vector $\vec{M}_{Rcv}$, the third matrix $P_{Ers}$, and the fourth matrix $P_{Rcv}$ to obtain the third equation.

The decoding apparatus may transform the first equation $P * \vec{M} = \vec{Y'}$ into the third equation $P_{Ers} * (\vec{M}_{Ers})^T = \vec{Y'} - P_{Rcv} * (\vec{M}_{Rcv})^T$. It can be understood that only $\vec{M}_{Ers}$ in the third equation includes an unknown variable, and the rest vectors and matrices are all known quantities.

711. The decoding apparatus parses the third equation to obtain a value of an unknown variable in the fourth vector $\vec{M}_{Ers}$.

After obtaining the third equation by means of reconstruction, the decoding apparatus parses the third equation to obtain the value of the unknown variable in the fourth vector $\vec{M}_{Ers}$.

It can be understood that when the decoding apparatus is parsing the third equation, if the third equation cannot be parsed, the decoding apparatus may report a decoding failure, or may receive an encoded packet again to perform decoding again, which is not limited herein.

712. The decoding apparatus combines the fifth vector $\vec{M}_{Rcv}$ indicating a non-erased original packet set and the fourth vector $\vec{M}_{Ers}$ indicating an erased original packet set that is obtained by parsing to obtain the complete original packet set.

After obtaining the value of the unknown variable in the fourth vector $\vec{M}_{Ers}$, the decoding apparatus combines the fifth vector $\vec{M}_{Rcv}$ indicating the non-erased original packet set and the fourth vector $\vec{M}_{Ers}$ that is obtained by parsing and that indicates the erased original packet set to obtain the complete original packet set.

In this embodiment of the present invention, a decoding apparatus first performs displacement on a third vector $\vec{M}$ in a first equation to obtain a fourth vector $\vec{M}_{Ers}$ and a fifth vector $\vec{M}_{Rcv}$, performs displacement, corresponding to the fourth vector $\vec{M}_{Ers}$ and the fifth vector $\vec{M}_{Rcv}$, on a first matrix P to obtain a third matrix $P_{Ers}$ and a fourth matrix $P_{Rcv}$, and transforms the first equation into a third equation according to these vectors, so that only the fourth vector $\overset{\omega}{M}_{Ers}$ in the third equation is an unknown variable, which simplifies an equation parsing process, reduces time for parsing the first equation, and increases a decoding rate.

It can be understood that the decoding apparatus may be applied in a communication scenario, for example, in a base station, a terminal device, or a relay node Relay. When a transmit end is located in a base station or in a Relay, the decoding apparatus may be located in a terminal device. When the transmit end is located in a terminal device, the decoding apparatus may be located in a base station or in a Relay. In this case, the decoding apparatus may receive an encoded packet transmitted by the transmit end. The decoding apparatus may also be applied in a storage system together with an encoding apparatus, and is configured to correct, delete, and restore a damaged storage unit in the storage system. When some of encoded packets stored in the storage system are erased, the decoding apparatus may acquire these encoded packets that have undergone erasing. The decoding apparatus may also be applied in other application scenarios, which is not limited herein.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The computer software product is stored in a storage medium and includes several instructions for instructing a computer device (which may be a personal computer, a server, a network device, or the like) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A decoding apparatus comprising:
    a receiver configured to receive an encoded packet from a transmit end;
    a non-transitory computer-readable medium having processor-executable instructions stored thereon; and
    a processor configured to execute the processor-executable instructions to facilitate the following operations:
    extracting a non-erased systematic packet from the encoded packet;
    obtaining an erased systematic packet by parsing according to a first relationship indicating a correspondence between the erased systematic packet and the encoded packet, wherein the first relationship comprises F unknown variables, wherein F is a quantity of erased systematic packets in a complete encoded packet set, and the unknown variables are used to indicate the erased systematic packets; and
    obtaining the complete systematic packet set, wherein obtaining the complete systematic packet set includes combining the extracted non-erased systematic packet and the erased systematic packet;
    wherein the processor is further configured to execute the processor-executable instructions to construct the first relationship by:
        constructing a second relationship indicating a correspondence between a systematic packet and an encoded packet;
        acquiring a first matrix P from the second relationship, wherein the first matrix P is associated with the erased systematic packet;
        extracting, from a first vector $Y_{NonSyn}$, that indicates an encoded packet set and that is in the second relationship, an encoded packet corresponding to the first matrix P to form a second vector Y'; and
        constructing the first relationship according to the second relationship, the first matrix P, and the second vector Y'.

2. The apparatus according to claim 1, wherein the processor is further configured to determine a second matrix C according to a preset matrix used during encoding and decoding; and
    wherein acquiring the first matrix P from the second relationship further comprises constructing, according to a preset rule, the first matrix P from the second matrix C.

3. The apparatus according to claim 2, wherein determining the second matrix C according to the preset matrix used during encoding and decoding further comprises:
    determining the second matrix C according to a preset relationship $C=J*A^-=[C_1, C_2]$, wherein a fifth matrix $A^-$ is an inverse matrix of a sixth matrix A, a seventh matrix J and the sixth matrix A are preset matrices used during encoding and decoding, an eighth matrix $C_1$ is the first (S+H) columns of the second matrix C, and a ninth matrix $C_2$ is the last K columns of the second matrix C, wherein S and H are preset values used during encoding.

4. The apparatus according to claim 3, wherein constructing, according to the preset rule, the first matrix P from the second matrix C further comprises:

selecting (F+ε) row vector or vectors from the ninth matrix $C_2$ according to a preset rule to form the first matrix $$P = \begin{bmatrix} p^v_{r_1} \\ p^v_{r_2} \\ M \\ p^v_{r_{F+\varepsilon}} \end{bmatrix},$$

wherein ε is a preset value, and the preset rule is as follows:

(1) in the row vector, not all F elements corresponding to F erased systematic packets in the third vector $\overset{\omega}{M}$ are zero; and (2) an encoded packet, in the first vector $\overset{u}{Y}_{NonSys}$, corresponding to the row vector is not erased; and wherein correspondence between the row vector and the third vector $\overset{\omega}{M}$, and correspondence between the row vector and the first vector $\overset{u}{Y}_{NonSys}$ are obtained according to the second relationship.

5. The apparatus according to claim 4, wherein extracting, from a first vector $\overset{u}{Y}_{NonSys}$ the encoded packet corresponding to the first matrix P to form the second vector $\overset{\omega}{Y'}$, further comprises:

extracting, from the first vector $\overset{u}{Y}_{NonSys}$, an encoded packet corresponding to (F+ε) row vector or vectors in the first matrix P to form the second vector $\overset{\omega}{Y'} = [y_{K+r_1}, y_{K+r_2}, \ldots y_{K+r_{F+\varepsilon}}]^T$.

6. The apparatus according to claim 5, wherein constructing the first relationship according to the second relationship, the first matrix P, and the second vector $\overset{\omega}{Y'}$ further comprises:

constructing the first relationship equation: $P * \overset{\omega}{M} = \overset{\omega}{Y'}$.

7. The apparatus according to claim 1, wherein obtaining the erased systematic packet by parsing according to the first relationship further comprises:

decomposing a third vector $\overset{\omega}{M}$ that indicates the complete systematic packet set and that is in the first relationship into a fourth vector $\overset{\omega}{M}_{Ers}$ and a fifth vector $\overset{\omega}{M}_{Rcv}$, wherein the fourth vector $\overset{\omega}{M}_{Ers}$ indicates an erased systematic packet set, and the fifth vector $\overset{\omega}{M}_{Rcv}$ indicates a non-erased systematic packet set;

performing decomposition, corresponding to the fourth vector $\overset{\omega}{M}_{Ers}$ and the fifth vector $\overset{\omega}{M}_{Rcv}$, on the first matrix P in the first relationship to obtain a third matrix $P_{Ers}$ and a fourth matrix $P_{Rcv}$;

reconstructing the first relationship according to the fourth vector $\overset{\omega}{M}_{Ers}$, the fifth vector $\overset{\omega}{M}_{Rcv}$, the third matrix $P_{Ers}$, and the fourth matrix $P_{Rcv}$, to obtain a third relationship; and parsing the third relationship to obtain a value of an unknown variable in the fourth vector $\overset{\omega}{M}_{Ers}$.

8. The apparatus according to claim 7, wherein extracting the non-erased systematic packet from the received encoded packet further comprises:

$$\vec{Y} = \begin{bmatrix} y_1 = m_1 \\ \vdots \\ y_K = m_K \\ y_{K+1} \\ y_{K+2} \\ \vdots \\ y_N \end{bmatrix}$$

extracting the non-erased systematic packet from a sixth vector indicating the complete encoded packet set, wherein the first K encoded packets of the sixth vector $\overset{\omega}{Y}$ constitute the third vector $\overset{\omega}{M}$, and K is a quantity of systematic packets in the third vector $\overset{\omega}{M}$.

9. The apparatus according to claim 8, wherein constructing the second relationship further comprises:

constructing the second relationship $C * \overset{\omega}{D} = \overset{\omega}{Y}_{NonSys}$, wherein the first (S+H) elements of a seventh vector $\overset{\omega}{D}$ are zero, and a vector constituted by the last K elements is the third vector $\overset{\omega}{M}$, that is $$\vec{D} = \begin{bmatrix} 0 \\ \vdots \\ 0 \\ m_1 \\ \vdots \\ m_K \end{bmatrix};$$

and wherein $$\vec{Y}_{NonSys} = \begin{bmatrix} y_{K+1} \\ y_{K+2} \\ \vdots \\ y_N \end{bmatrix}$$

is acquired from the sixth vector $$\vec{Y} = \begin{bmatrix} y_1 = m_1 \\ \vdots \\ y_K = m_K \\ y_{K+1} \\ y_{K+2} \\ \vdots \\ y_N \end{bmatrix}$$

S and H are preset values used during encoding, and N is a positive integer that is greater than or equal to K.

10. The apparatus according to claim 7, wherein decomposing the third vector $\overset{\omega}{\vec{M}}$ into the fourth vector $\overset{\omega}{\vec{M}}_{Ers}$ and the fifth vector $\overset{\omega}{\vec{M}}_{Rcv}$ further comprises:

displacing the F erased systematic packets in the third vector $\overset{\omega}{\vec{M}}$ to the first F locations to form an eighth vector $$\vec{M}' = \begin{bmatrix} (\vec{M}_{Ers})^T \\ (\vec{M}_{Rcv})^T \end{bmatrix} = \begin{bmatrix} m_{e_1} \\ m_{e_2} \\ \vdots \\ m_{e_f} \\ (\vec{M}_{Rcv})^T \end{bmatrix}.$$

11. The apparatus according to claim 10, wherein performing decomposition, corresponding to the fourth vector $\overset{\omega}{\vec{M}}_{Ers}$ and the fifth vector $\overset{\omega}{\vec{M}}_{Rcv}$, on the first matrix P in the first relationship to obtain the third matrix $P_{Ers}$ and the fourth matrix $P_{Rcv}$ further comprises:

performing displacement, corresponding to the eighth vector $\overset{\omega}{\vec{M}}'$, on the first matrix P to obtain a tenth matrix $P'=[P_{Ers},P_{Rcv}]$, wherein each column in the third matrix $P_{Ers}$ corresponds to an erased systematic packet in the fourth vector $\overset{\omega}{\vec{M}}_{Ers}$, and each column in the fourth matrix $P_{Rcv}$ corresponds to a non-erased systematic packet in the fifth vector $\overset{\omega}{\vec{M}}_{Rcv}$.

12. The apparatus according to claim 11, wherein reconstructing the first relationship according to the fourth vector $\overset{\omega}{\vec{M}}_{Ers}$, the fifth vector $\overset{\omega}{\vec{M}}_{Rcv}$, the third matrix $P_{Ers}$, and the fourth matrix $P_{Rcv}$ to obtain the third relationship further comprises:

transforming the first relationship $P * \overset{\omega}{\vec{M}} = \vec{Y}'$ into the third relationship $P_{Ers} * (\overset{\omega}{\vec{M}}_{Ers})^T = \vec{Y}' - P_{Rcv} * (\overset{\omega}{\vec{M}}_{Rcv})^T$.

13. The apparatus according to claim 12, wherein obtaining the complete systematic packet set by combining the extracted non-erased systematic packet and the erased systematic packet further comprises:

combining the fifth vector $\overset{\omega}{\vec{M}}_{Rcv}$ indicating the non-erased systematic packet set and the fourth vector $\overset{\omega}{\vec{M}}_{Ers}$ that is obtained by parsing and that indicates the erased systematic packet set to obtain the complete systematic packet set.

14. A systematic code decoding method comprising:
acquiring, by a decoding apparatus, an encoded packet that has passed through an erasure channel;
extracting, by the decoding apparatus, a non-erased systematic packet from the encoded packet;
obtaining, by the decoding apparatus by parsing, an erased systematic packet according to a first relationship, wherein the first relationship is an relationship indicating a correspondence between the erased systematic packet and the encoded packet, and the first relationship comprises F unknown variables, wherein F is a quantity of erased systematic packets in a complete encoded packet set, and the unknown variables are used to indicate the erased systematic packets; and
obtaining, by the decoding apparatus, the complete systematic packet set, wherein obtaining the complete systematic packet set includes combining the extracted non-erased systematic packet and the erased systematic packet;
wherein the first relationship is obtained by:
constructing, by the decoding apparatus, a second relationship, wherein the second relationship is an relationship indicating a correspondence between a systematic packet and an encoded packet;
acquiring, by the decoding apparatus, a first matrix P from the second relationship, wherein the first matrix P is associated with the erased systematic packet;
extracting, by the decoding apparatus from a first vector $Y_{NonSys}$ that indicates an encoded packet set and that is in the second relationship, an encoded packet corresponding to the first matrix P to form a second vector Y';
and
constructing, by the decoding apparatus, the first relationship according to the second relationship, the first matrix P, and the second vector Y'.

15. The method according to claim 14, wherein before constructing the second relationship, the method further comprises calculating, by the decoding apparatus, a second matrix C according to a preset matrix used during encoding and decoding; and
wherein acquiring the first matrix P from the second relationship further comprises constructing, by the decoding apparatus, the first matrix P from the second matrix C according to a preset rule.

16. The method according to claim 15, wherein calculating the second matrix C according to the preset matrix used during encoding and decoding comprises:
calculating, by the decoding apparatus, the second matrix C according to a preset relationship $C=J*A^{-1}=[C_1,C_2]$, wherein a fifth matrix $A^{-1}$ is an inverse matrix of a sixth matrix A, a seventh matrix J and the sixth matrix A are the preset matrices used during encoding and decoding, an eighth matrix $C_1$ is the first (S+H) columns of the second matrix C, and a ninth matrix $C_2$ is the last K columns of the second matrix C, wherein S and H are preset values used during encoding.

17. The method according to claim 14, wherein obtaining the erased systematic packet according to the first relationship further comprises:
decomposing, by the decoding apparatus, a third vector $\overset{\omega}{\vec{M}}$ that indicates the complete systematic packet set and that is in the first relationship into a fourth vector $\overset{\omega}{\vec{M}}_{Ers}$ and a fifth vector $\overset{\omega}{\vec{M}}_{Rcv}$, wherein the fourth vector $\vec{M}_{Ers}$ indicates an erased systematic packet set, and the fifth vector $\vec{M}_{Rcv}$ indicates a non-erased systematic packet set;

performing, by the decoding apparatus, decomposition, corresponding to the fourth vector $\vec{M}_{Ers}$ and the fifth vector $\vec{M}_{Rcv}$, on the first matrix P in the first relationship to obtain a third matrix $P_{Ers}$ and a fourth matrix $P_{Rcv}$;

reconstructing, by the decoding apparatus, the first relationship according to the fourth vector $\vec{M}_{Ers}$, the fifth vector $\vec{M}_{Rcv}$, the third matrix $P_{Ers}$, and the fourth matrix $P_{Rcv}$, to obtain a third relationship; and parsing, by the decoding apparatus, the third relationship to obtain a value of an unknown variable in the fourth vector $\vec{M}_{Ers}$.

18. The method according to claim 17, wherein extracting the non-erased systematic packet from the encoded packet further comprises:

extracting, by the decoding apparatus, the non-erased systematic packet from a sixth vector $$\vec{Y} = \begin{bmatrix} y_1 = m_1 \\ \vdots \\ y_K = m_K \\ y_{K+1} \\ y_{K+2} \\ \vdots \\ y_N \end{bmatrix}$$

indicating the complete encoded packet set, wherein the first K encoded packets of the sixth vector $\vec{Y}$ constitute the third vector $\vec{M}$, and K is a quantity of systematic packets in the third vector $\vec{M}$.

19. The method according to claim 18, wherein constructing the second relationship further comprises:

constructing, by the decoding apparatus, the second relationship $C * \vec{D} = \vec{Y}_{NonSys}$, wherein the first (S+H) elements of the seventh vector $\vec{D}$ are zero, and a vector constituted by the last K elements is the third vector $\vec{M}$, that is $$\vec{D} = \begin{bmatrix} 0 \\ \vdots \\ 0 \\ m_1 \\ \vdots \\ m_K \end{bmatrix};$$

and wherein $$\vec{Y}_{NonSys} = \begin{bmatrix} y_{K+1} \\ y_{K+2} \\ \vdots \\ y_N \end{bmatrix}$$

is acquired from the sixth vector $$\vec{Y} = \begin{bmatrix} y_1 = m_1 \\ \vdots \\ y_K = m_K \\ y_{K+1} \\ y_{K+2} \\ \vdots \\ y_N \end{bmatrix}$$

S and H are preset values used during encoding, K is a quantity of systematic packets in the complete systematic packet set, and N is a positive integer that is greater than or equal to K.

20. A non-transitory computer-readable medium having processor-executable instructions stored thereon that, when executed by a processor, provide for the following operations:

extracting a non-erased systematic packet from a received encoded packet;

obtaining an erased systematic packet by parsing according to a first relationship indicating a correspondence between the erased systematic packet and the encoded packet, wherein the first relationship comprises F unknown variables, wherein F is a quantity of erased systematic packets in a complete encoded packet set, and the unknown variables are used to indicate the erased systematic packets;

obtaining the complete systematic packet set, wherein obtaining the complete systematic packet set includes combining the extracted non-erased systematic packet and the erased systematic packet; and constructing the first relationship by:
constructing a second relationship indicating a correspondence between a systematic packet and an encoded packet;
acquiring a first matrix P from the second relationship, wherein the first matrix P is associated with the erased systematic packet;
extracting, from a first vector $Y_{NonSys}$ that indicates an encoded packet set and that is in the second relationship, an encoded packet corresponding to the first matrix P to form a second vector Y'; and
constructing the first relationship according to the second relationship, the first matrix P, and the second vector Y'.

21. The non-transitory computer-readable medium according to claim 20 further including instructions for determining a second matrix C according to a preset matrix used during encoding and decoding; and wherein acquiring the first matrix P from the second relationship further comprises constructing, according to a preset rule, the first matrix P from the second matrix C.

* * * * *